(12) United States Patent
Oda et al.

(10) Patent No.: US 9,948,305 B2
(45) Date of Patent: Apr. 17, 2018

(54) INTEGRATED CIRCUIT AND ELECTRONIC APPARATUS

(71) Applicant: KABUSHIKI KAISHA TOSHIBA, Minato-ku (JP)

(72) Inventors: Masato Oda, Yokohama (JP); Shinichi Yasuda, Setagaya (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/445,450

(22) Filed: Feb. 28, 2017

(65) Prior Publication Data

US 2018/0062659 A1 Mar. 1, 2018

(30) Foreign Application Priority Data

Aug. 30, 2016 (JP) .................................. 2016-168013

(51) Int. Cl.
| | |
|---|---|
| *H03K 19/177* | (2006.01) |
| *H01L 25/00* | (2006.01) |
| *H03K 19/173* | (2006.01) |
| *H01L 23/525* | (2006.01) |

(52) U.S. Cl.
CPC ..... *H03K 19/1737* (2013.01); *H01L 23/5252* (2013.01); *H03K 19/1735* (2013.01); *H03K 19/1776* (2013.01); *H03K 19/17728* (2013.01)

(58) Field of Classification Search
None
See application file for complete search history.

(56) References Cited

U.S. PATENT DOCUMENTS

| 4,758,745 A | 7/1988 | Elgamal et al. | |
|---|---|---|---|
| 8,872,542 B2 * | 10/2014 | Sakimura | G11C 13/0004 326/38 |
| 9,264,044 B2 | 2/2016 | Yasuda et al. | |
| 2008/0211539 A1 * | 9/2008 | Parkinson | G11C 13/0004 326/41 |

FOREIGN PATENT DOCUMENTS

| JP | 3-157017 | 7/1991 |
|---|---|---|
| JP | 5-55532 | 3/1993 |
| JP | 2015-142175 | 8/2015 |
| WO | WO97/47088 | 12/1997 |

* cited by examiner

*Primary Examiner* — Anh Tran
(74) *Attorney, Agent, or Firm* — Oblon, McClelland, Maier & Neustadt, L.L.P.

(57) ABSTRACT

An integrated circuit of an embodiment includes: a first to third wiring lines; a first and second input terminals connected to the second and third wiring lines respectively; a first and second control terminals; a first switch element disposed between the first and second wiring lines, the first switch element including a first and second terminals connected to the first and second wiring lines respectively; a second switch element disposed between the first and third wiring lines, the second switch element including a third and fourth terminals connected to the first and fourth terminals connected to the first and third wiring lines respectively; a first transistor including a source and a drain, one of the source and the drain being connected to the first wiring line; a select circuit including a fifth to eighth terminals; and a logic circuit including a ninth to eleventh terminals.

17 Claims, 22 Drawing Sheets

|  | WRITING | OPERATION | TESTING |
|---|---|---|---|
| We | Low(0) | Low(0) | High(1) |
| $Vbst_1$ | Low(0) | High(1) | High(1) |
| $Rselect_i(i=1\sim4)$ | Low(0) | High(1) | Low(0) |
| $VR_i(i=1\sim4)$ | Vwrite/Vinhibit | Vdd | Vdd |
| $Cselect_j(j=1\sim4)$ | High(1) | Low(0) | Low(0) |
| $VC_j(j=1\sim4)$ | Vss/Vinhibit | Vss | Vss |

FIG. 12

|  | WRITING | OPERATION | TESTING |
|---|---|---|---|
| $We_1$ | Low(0) | Low(0) | High(1) |
| $We_2$ | Low(0) | High(1) | High(1) |
| $Rselect_i (i=1\sim 4)$ | Low(0) | High(1) | Low(0) |
| $VR_i (i=1\sim 4)$ | Vwrite/Vinhibit | Vdd | Vdd |
| $Cselect_j (j=1\sim 4)$ | Low(0)/High(1) | Vss | Vss |

FIG. 20

INTEGRATED CIRCUIT AND ELECTRONIC APPARATUS

CROSS REFERENCE TO RELATED APPLICATIONS

This application is based upon and claims the benefit of priority from prior Japanese Patent Application No. 2016-168013 filed on Aug. 30, 2016 in Japan, the entire contents of which are incorporated herein by reference.

FIELD

Embodiments of the present invention relate to integrated circuits and electronic apparatuses.

BACKGROUND

A field programmable gate array (FPGA) is an integrated circuit that can achieve an appropriate logical function. An FPGA includes logical blocks (LBs) that perform appropriate logical operations, and switch blocks (SBs) that switch wiring line connections among the logical blocks. Each logical block includes at least a look-up table circuit (hereinafter also referred to as a LUT circuit), and the LUT circuit outputs a value stored in a memory in accordance with an input pattern. As this memory is rewritten, a wiring line switching function can be implemented in the LUT circuit.

Each switch block switches connections between wiring lines, and has the functions of a multiplexer circuit (hereinafter also referred to as a MUX circuit). A MUX circuit has a function to select one of the input terminals and connect the selected input terminal to the output terminal. Each switch block includes at least one MUX circuit. A switch block in which all the input terminals can be connected to all the output terminals is called a cross-point switch block.

Such a cross-point switch block has a problem of large power consumption due to leakage from the gates of transistors as will be described later.

BRIEF DESCRIPTION OF THE DRAWINGS

FIG. 12 is a table showing the signals to be applied to the respective terminals at a time of writing, at a time of an operation, and at a time of testing in the second embodiment.

FIG. 20 is a table showing the signals to be applied to the respective terminals at a time of writing, at a time of an operation, and at a time of testing in the third modification.

DETAILED DESCRIPTION

An integrated circuit according to an embodiment includes: a first wiring line; second and third wiring lines intersecting with the first wiring line; a first input terminal connected to the second wiring line; a second input terminal connected to the third wiring line; a first control terminal; a second control terminal; an output terminal; a first switch element disposed in a cross region between the first wiring line and the second wiring line, the first switch element including a first terminal connected to the first wiring line and a second terminal connected to the second wiring line; a second switch element disposed in a cross region between the first wiring line and the third wiring line, the second switch element including a third terminal connected to the first wiring line and a fourth terminal connected to the third wiring line; a first transistor including a source and a drain, one of the source and the drain being connected to the first wiring line; a select circuit including a fifth terminal connected to the second control terminal, a sixth terminal connected to the second wiring line, a seventh terminal connected to the first control terminal, and an eighth terminal, the select circuit connecting the eighth terminal to one of the fifth and sixth terminals in accordance with a first control signal from the first control terminal; and a logic circuit including a ninth terminal connected to the eighth terminal, a tenth terminal connected to the first wiring line, and an eleventh terminal connected to the output terminal.

The background to the development of the present invention is explained below, before embodiments of the present invention are described.

Figure 1:
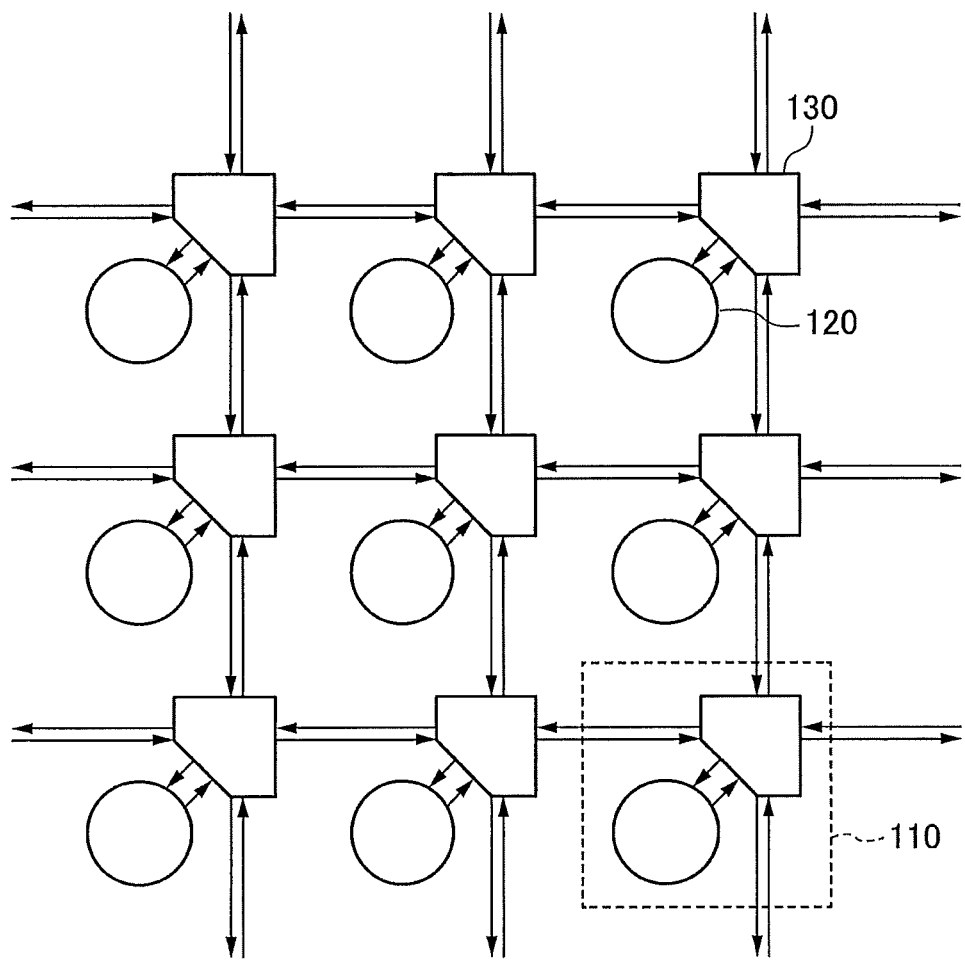
FIG. 1 is a block diagram showing the configuration of an FPGA.

First, the configuration of a typical FPGA is described. As shown in FIG. 1, an FPGA 100 normally includes basic blocks 110 arranged in an array. Each basic block 110 is connected to adjacent basic blocks 110 by wiring lines. Each basic block 110 includes a logical block 120 and a switch block 130. The logical block 120 is a block that performs a logical operation, and its basic configuration is formed with a look-up table including a truth table. Each switch block 130 controls the connection/disconnection of a wiring line connected to an adjacent basic block 110 and enables transmission of a signal in any direction.

Also, each switch block 130 connects to each corresponding logical block 120. The logical blocks 120 and the switch blocks 130 can perform connection control in accordance with the data stored in the respective configuration memories.

Figure 2:
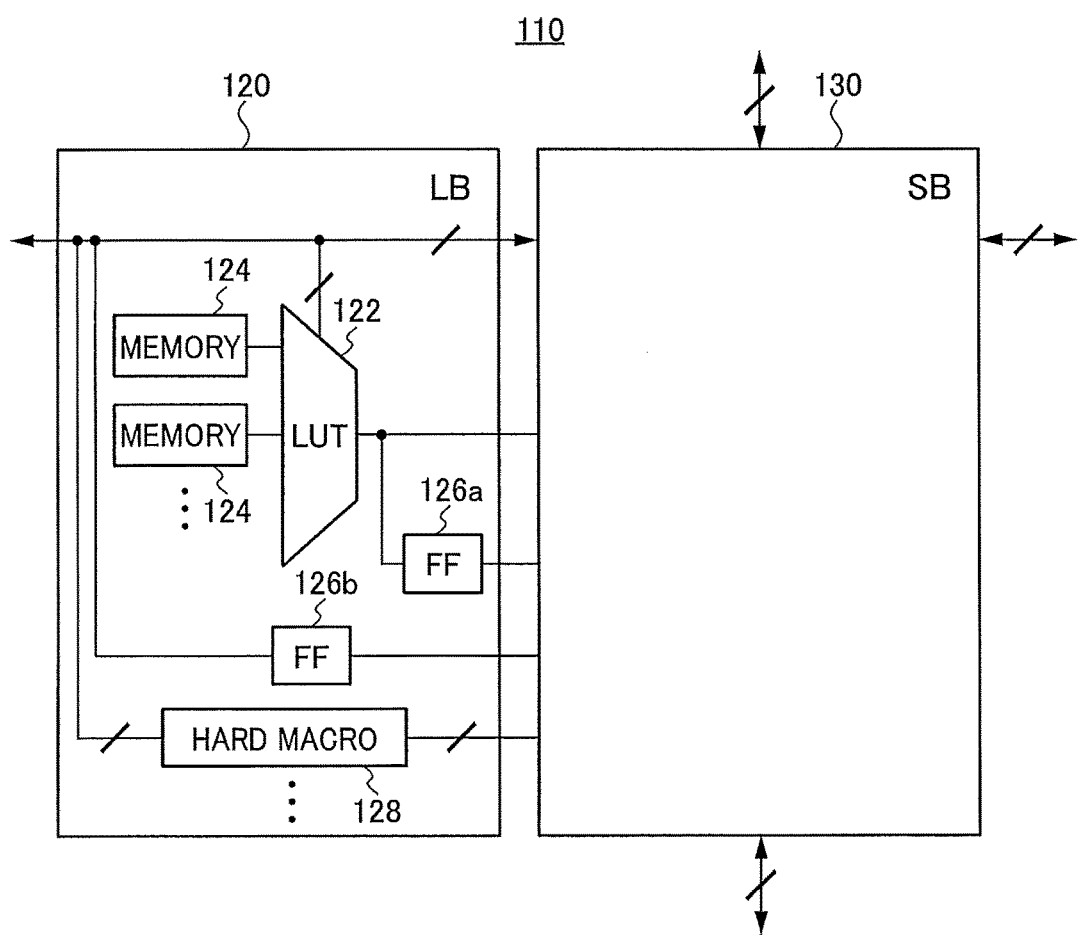
FIG. 2 is a block diagram showing an example configuration of a logical block.

As shown in FIG. 2, each logical block 120 includes a look-up table circuit 122 (hereinafter also referred to as the LUT circuit 122) and a memory 124. The LUT circuit 122 outputs information stored in the memory 124 in accordance with an input. It is possible to implement any appropriate function in the LUT circuit 122 by rewriting the information stored in the memory 124.

Figure 3A:
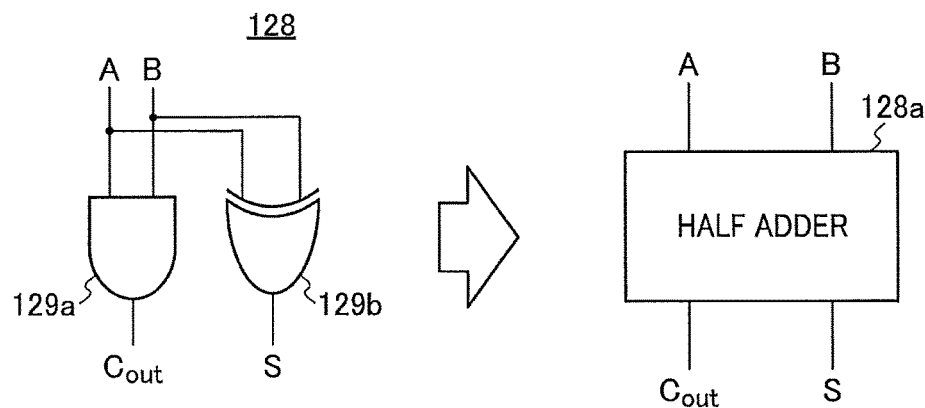
FIG. 3A is a diagram showing an example of a hard macro.
Figure 3B:
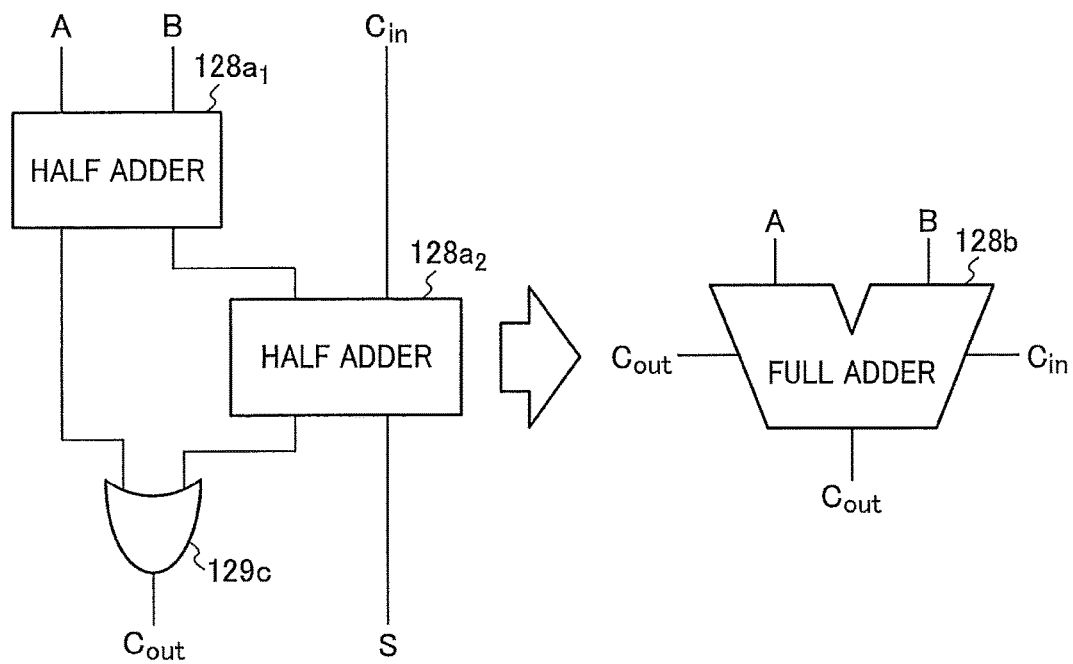
FIG. 3B is a diagram showing another example of a hard macro.

In addition to that, the logical block 120 may include flip-flop circuits 126a and 126b, and a hard macro 128. The flip-flop circuit 126a is connected to an output terminal of the LUT circuit 122, and the flip-flop circuit 126b is directly connected to an input terminal of the logical block 120. Here, the hard macro 128 is a group of circuits that are designed in advance. For example, as shown in FIG. 3A, an example of the hard macro 128 is a half adder 128a including an AND gate 129a and an XOR gate 129b. Another example of the hard macro 128 is a full adder 128b including half adders 128a₁ and 128a₂, and an OR gate 129c.

Figure 4:
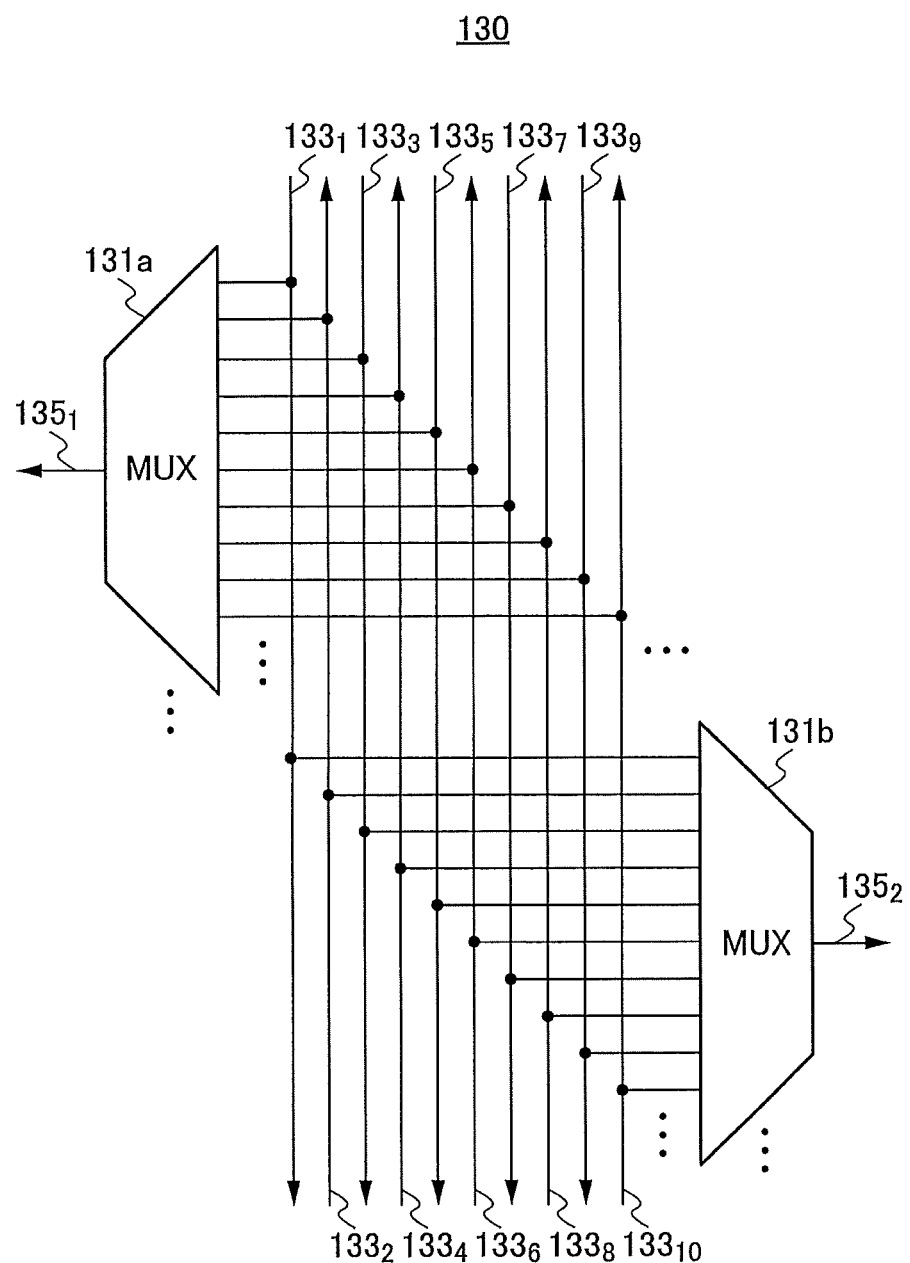
FIG. 4 is a diagram showing an example of a switch block including an MUX.

Each switch block 130 includes multiplexer circuits (hereinafter also referred to as MUX circuits). FIG. 4 shows an example of a switch block 130. This switch block 130 includes two MUX circuits 131a and 131b. Each of these MUX circuits 131a and 131b has a function to select an input terminal from among the input terminals connected to wiring lines $133_1$ through $133_{10}$, and connect the selected input terminal to the corresponding one of the output terminals connected to wiring lines $135_1$ and $135_2$. In this manner, the switch block 130 includes two or more output terminals.

Figure 5:
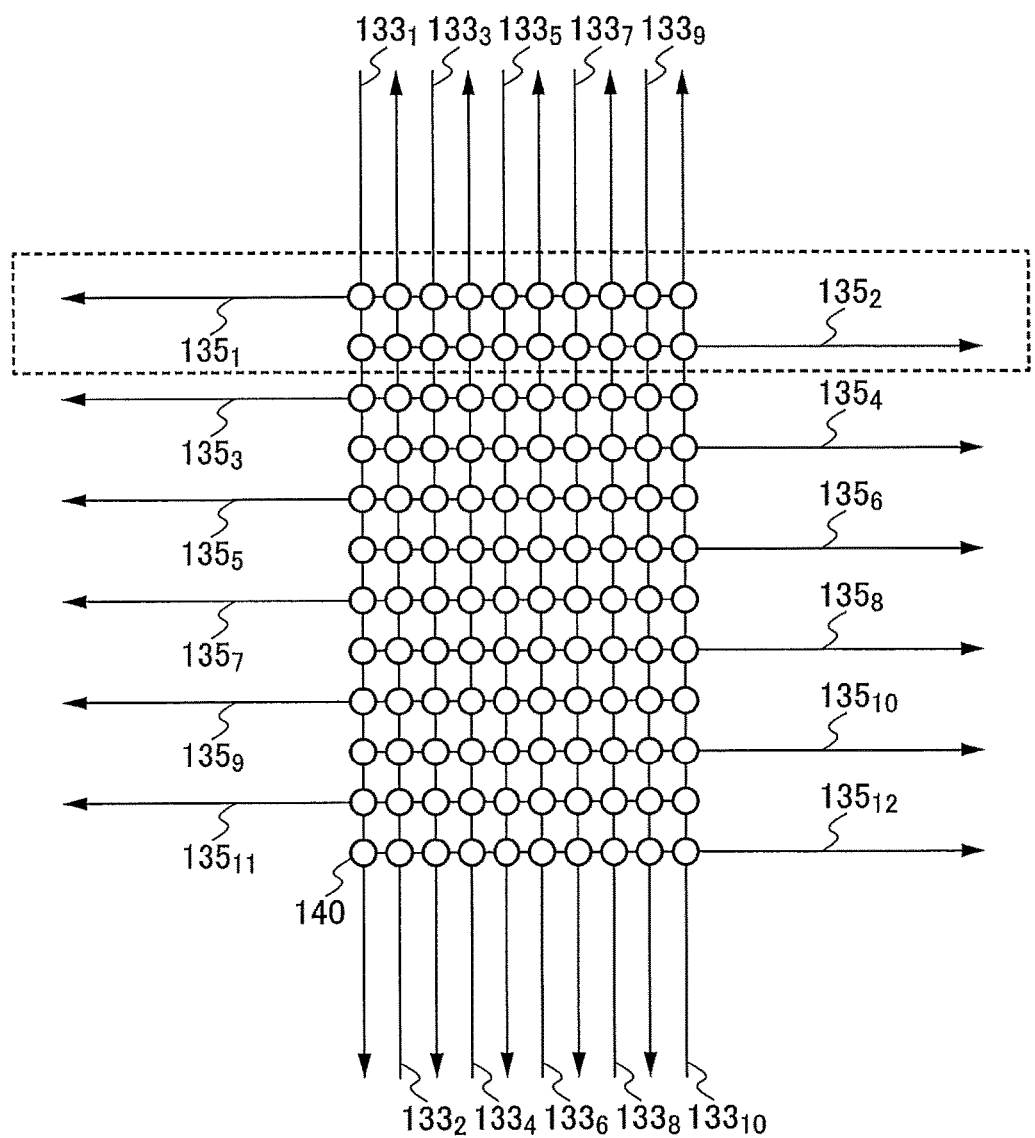
FIG. 5 is a diagram showing an example of a cross-point switch block.

FIG. 5 shows another example of a switch block 130. This switch block 130 shown in FIG. 5 includes switch circuits 140 arranged in a matrix. The switch circuits 140 aligned in the same row are connected to one output wiring line. For example, in FIG. 5, the switch circuits 140 aligned in the (2i−1)-th row (i=1, . . . , 6) from the top are connected to the row wiring line $135_{2i-1}$ through which a signal is output to the left, and the switch circuits 140 aligned in the 2ith row are connected to the row wiring line $135_{2i}$ through which a signal is output to the right. The switch circuits 140 aligned in the (2j−1)-th column (j=1, . . . , 5) from the left are connected to the column wiring line $133_{2j-1}$, and the switch circuits 140 aligned in the 2jth column are connected to the column wiring line $133_{2j}$. That is, the switch circuits 140 are disposed in the cross regions between the wiring lines $133_1$ through $133_{10}$ and the row wiring lines $135_1$ through $135_{12}$. Each switch circuit 140 determines the existence/nonexistence of a connection between the corresponding wiring line among the column wiring lines $133_1$ through $133_{10}$ and the corresponding wiring line among the row wiring lines $135_1$ through $135_{12}$. It should be noted that the switch circuits 140 aligned in the first row from the top and the switch circuits 140 aligned in the second row have the same functions as those of the MUX circuits 131a and 131b shown in FIG. 4.

In this manner, all the inputs of the switch block 130 shown in FIG. 5 can be connected to all the outputs. A switch block that has switch circuits arranged in the cross regions between a set of wiring lines and another set of wiring lines, and has all the inputs connectable to all the outputs as above is called a cross-point switch block.

MUX circuits using complementary metal-oxide semiconductor (CMOS) transistors are also known. However, since an increase in the area relative to an increase in the number of inputs is large in such a MUX circuit. Therefore, an architecture in which all the inputs to the switch block are not input via MUX circuits but are input after thinning is employed in some cases.

Where resistive change elements or anti-fuse elements are used as two-terminal switch elements, the increase in the area can be reduced. Examples of resistive change elements include a magnetic tunnel junction (MTJ) element, an oxidation-reduction resistive change element, an ion-conducting resistive change element, and a phase-change element. Examples of anti-fuse elements include a one-time programmable (OTP) element such as a gate-oxide-film breakdown transistor.

Figure 6:
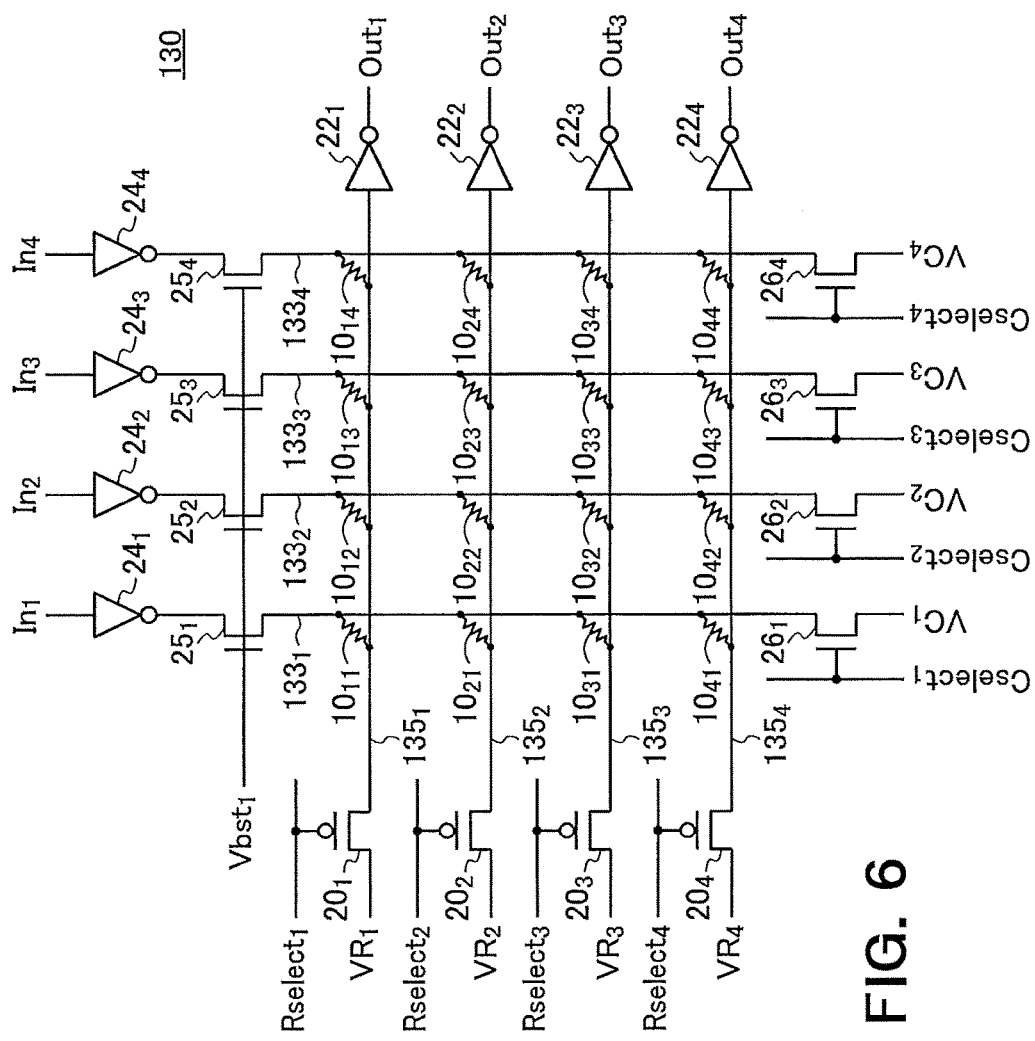
FIG. 6 is a diagram showing a specific example of a cross-point switch block using two-terminal switch elements.

FIG. 6 shows a specific example of a cross-point switch block in which two-terminal switch elements are used as switch circuits. This switch block 130 includes two-terminal switch elements $10_{ij}$ (i, j=1, 2, 3, 4), p-channel transistors $20_1$ through $20_4$, inverters $22_1$ through $22_4$, inverters $24_1$ through $24_4$, n-channel transistors $25_1$ through $25_4$, n-channel transistors $26_1$ through $26_4$, input terminals $In_j$ through which inputs to the inverters $24_j$ (j=1, 2, 3, 4) are made, and output terminals $Out_i$ through which outputs from the inverters $22_i$ (i=1, 2, 3, 4) are made.

The input terminals $In_j$ (j=1, 2, 3, 4) are connected to column wiring lines $133_j$ via the inverters $24_j$ and the transistors $25_j$. The output terminals $Out_i$ (i=1, 2, 3, 4) are connected to row wiring lines $135_i$ via the inverters $22_i$.

Also, the two-terminal switch elements $10_{ij}$ (i, j=1, 2, 3, 4) are provided in the cross regions between the column wiring lines $133_j$ and the row wiring lines $135_i$. One of the two terminals of each two-terminal switch element $10_{ij}$ is connected to the corresponding column wiring line $133_j$, and the other terminal is connected to the corresponding row wiring line $135_i$.

The transistors $20_i$ (i=1, 2, 3, 4) each have one of the source and the drain connected to the corresponding row wiring line $135_i$, have a signal $VR_i$ applied to the other one of the source and the drain, and receive a row select signal $Rselect_i$ at the gate. The transistors $25_j$ (j=1, 2, 3, 4) each receive a signal $Vbst_1$ at the gate. The transistors $26_j$ (j=1, 2, 3, 4) each have one of the source and the drain connected to the corresponding column wiring line $133_j$, have a signal $VC_j$ applied to the other one of the source and the drain, and receive a column select signal $Cselect_j$ at the gate.

Figure 7:
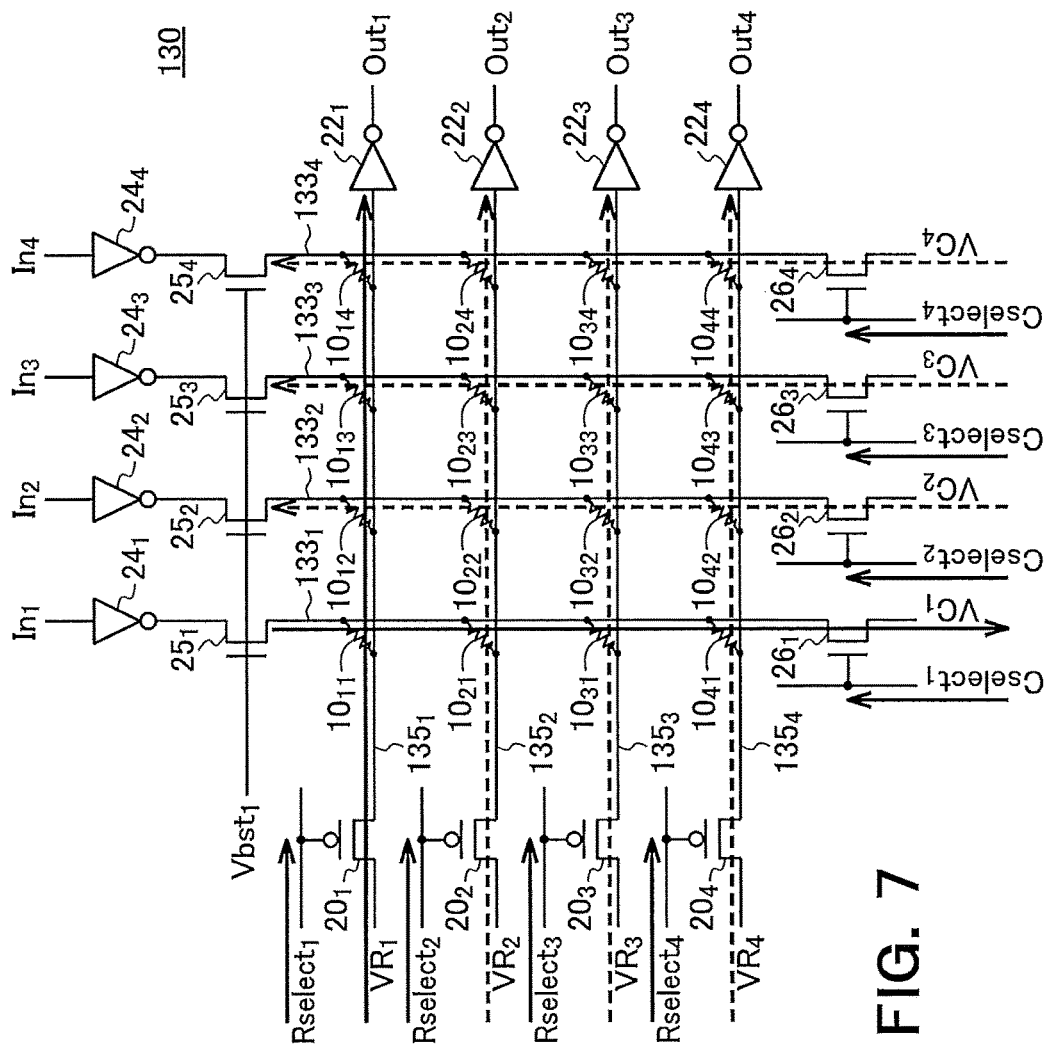
FIG. 7 is a diagram for explaining an example of writing in the switch block shown in FIG. 6.

Referring now to FIG. 7, an example of writing on a switch block having the above described configuration is described. The writing described herein is an example case where writing is performed on the switch element $10_{11}$. A voltage to put the transistor $20_1$ into an on-state, such as Vss, is applied to the row select signal $Rselect_1$, and a voltage to put the transistor $26_1$ into an on-state, such as Vdd, is applied to the column select signal $Cselect_1$. A write voltage $VR_1$ is then applied to the source of the transistor $20_1$ in an on-state, and a voltage $VC_1$ is applied to the source of the transistor $26_1$ in an on-state.

This voltage $VC_1$ is such a voltage that the voltage $(=VR_1-VC_1)$ to be applied between the two terminals of the switch element $10_{11}$ becomes higher than the threshold voltage for performing writing on the switch element $10_{11}$. That is, the threshold voltage is lower than $VR_1-VC_1$. With this, writing on the switch element $10_{11}$ can be performed. A write inhibiting voltage Vinhibit is applied to the two terminals of each of the other switch elements, to prevent wrong writing on any switch element other than the switch element on which writing is to be performed. Here, the write inhibiting voltage Vinhibit satisfies the following conditions:

threshold voltage>$VR_1$−Vinhibit, and threshold voltage>Vinhibit−$VC_1$.

Since these voltages leak from the inverters $24_1$ through $24_4$ on the input side, the transistors $25_1$ through $25_4$ are necessary. At a time of writing, these transistors $25_1$ through $25_4$ are put into an off-state, and thus, are disconnected from the inverters $24_1$ through $24_4$. There is no possibility of the voltages leaking from the inverters $22_1$ through $22_4$ on the output side, because the gates of the transistors forming these inverters are connected to the row wiring lines $135_1$ through $135_4$. However, in a case where the write voltages $VR_1$ through $VR_4$ are higher than the gate breakdown voltages of the transistors forming the above inverters, the inverters $22_1$ through $22_4$ break due to write operations.

Figure 8:
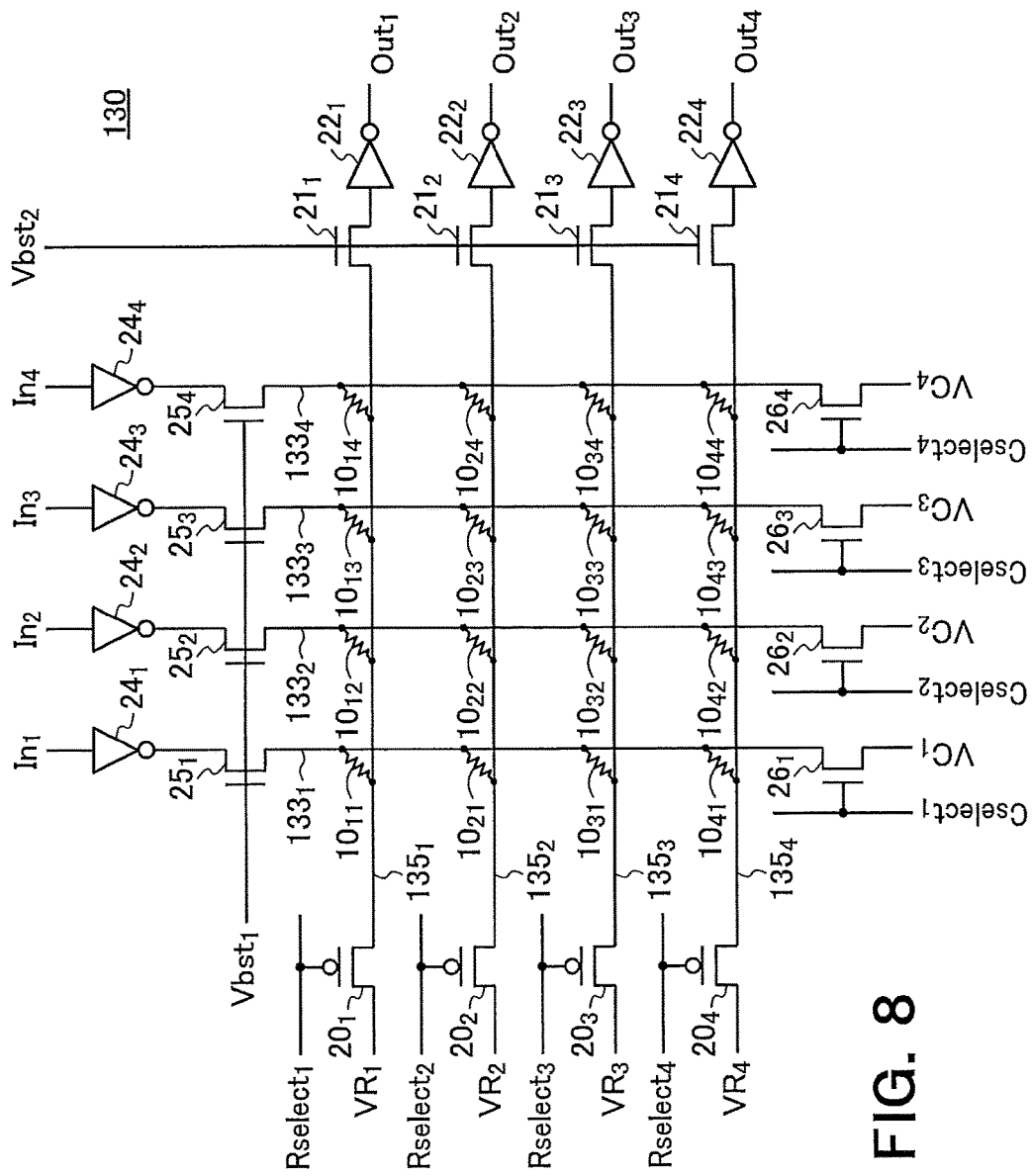
FIG. 8 is a diagram showing an example of the switch block shown in FIG. 6.

To counter this, cutoff transistors $21_i$ (i=1, 2, 3, 4) are disposed between the row wiring lines $135_i$ and the inverters $22_i$, as shown in FIG. 8. If the potential difference between the signal $Vbst_2$ applied to the gate and the write voltage $VR_i$ (i=1, 2, 3, 4) is smaller than the gate breakdown voltage in each cutoff transistor $21_i$, breaking of the gate of the cutoff transistor $21_i$ can be prevented. Further, where Vth represents the threshold voltage of each cutoff transistor $21_i$ (i=1, 2, 3, 4), only a voltage $Vbst_2$−Vth is applied to the inverter $22_i$ at a maximum. Therefore, if $Vbst_2$ is lower than the gate breakdown voltage of the transistor forming the inverter $22_i$ (i=1, 2, 3, 4), breaking of the inverter $22_i$ (i=1, 2, 3, 4) can also be prevented.

The circuit configuration around this two-terminal switch element is a known configuration. This circuit configuration has two problems. One of the problems is the power consumption of the cutoff transistors. Each cutoff transistor needs to be an n-channel MOSFET (hereinafter also referred to as an n-MOS). This is because, in a p-channel MOSFET (hereinafter also referred to as a p-MOS), the source/drain and the substrate form a forward diode. If a voltage not lower than the substrate voltage is applied to the source/drain at a time of writing, a current flows toward the substrate, and the write voltage becomes lower. Therefore, p-MOSs cannot be used. In an n-MOS, on the other hand, only a voltage expressed as "gate voltage−Vth" can be transmitted at a maximum. Therefore, to prevent degradation of the operation speed and leakage through the inverters, a higher voltage than the normal operating voltage Vdd needs to be applied to the gate of each cutoff transistor. As a result, the high voltages applied between the gate and the source/drain and between the gate and the substrate increase the gate leakage current.

The other problem lies in the difficulty in testing the circuits around a cross-point switch block. Particularly, in a case where the above described anti-fuse elements are used, operations of the peripheral CMOS circuits cannot be checked before a user finishes writing. Even in a case where variable resistive memories are used, the speeds of writing/erasing operations are expected to be much lower than those in a case where SRAM memories are used as in conventional FPGAs. Therefore, the time cost of chip-testing might become higher.

In view of the above, the inventors made intensive studies, to succeed in obtaining an integrated circuit that can reduce the leakage current and also reduce the power consumption. This integrated circuit will be described below as an embodiment.

First Embodiment

Figure 9:
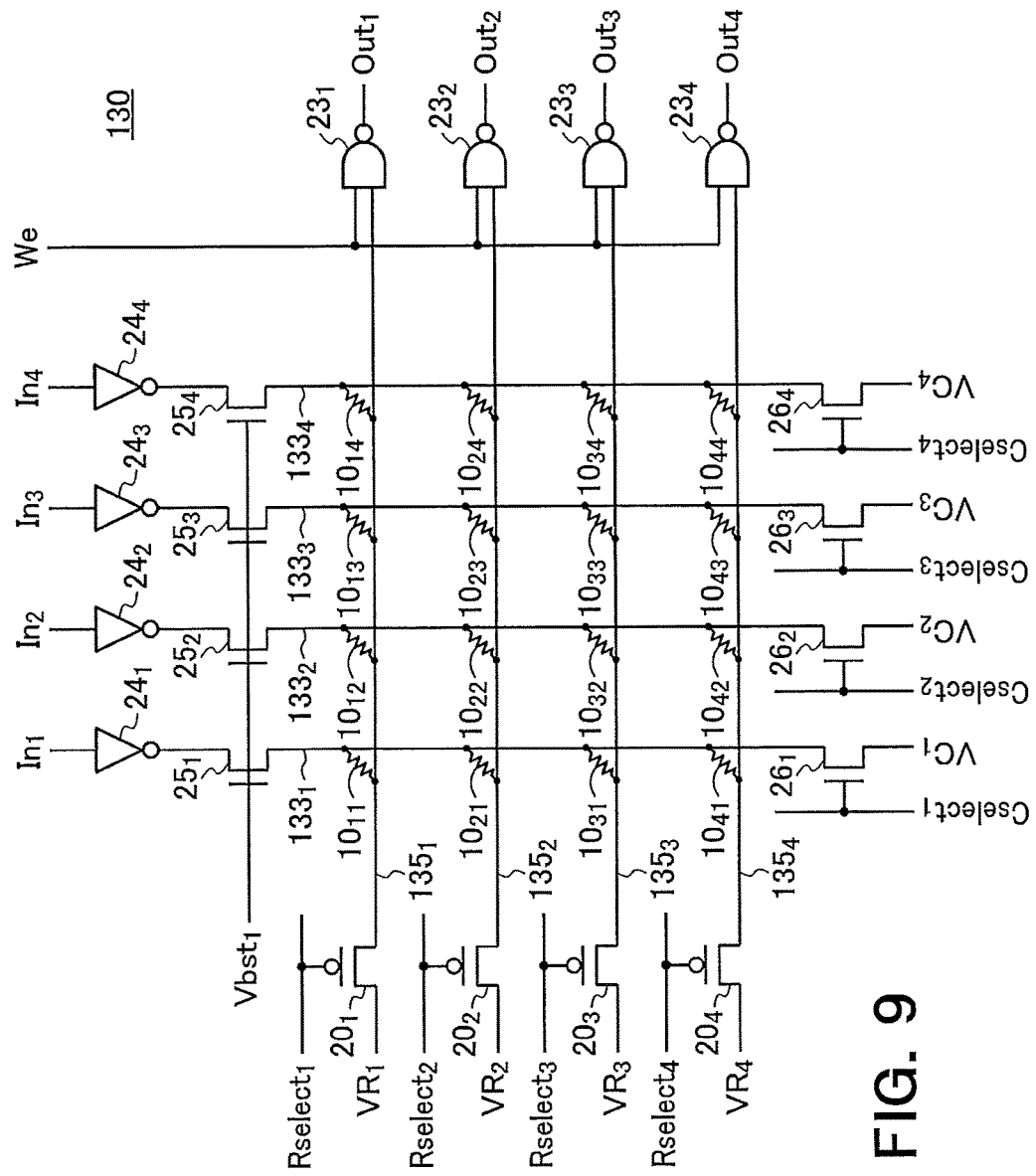
FIG. 9 is a circuit diagram showing an integrated circuit according to a first embodiment.

FIG. 9 shows an integrated circuit according to a first embodiment. This integrated circuit of the first embodiment includes a switch block 130 that is used in an FPGA, for example. This switch block 130 has the same configuration as the switch block 130 shown in FIG. 8, except that the cutoff transistors $21_1$ through $21_4$ and the inverters $22_1$ through $22_4$ are replaced with logic circuits $23_1$ through $23_4$. In the embodiment described below, the logic circuits $23_1$ through $23_4$ are NAND gates, for example. Alternatively, AND gates or the like may be used.

The switch block 130 of the first embodiment including the above configuration includes two-terminal switch elements $10_{ij}$ (i, j=1, 2, 3, 4), p-channel transistors $20_1$ through $20_4$, NAND gates $23_1$ through $23_4$, inverters $24_1$ through $24_4$, n-channel transistors $25_1$ through $25_4$, n-channel transistors $26_1$ through $26_4$, input terminals $In_j$ through which inputs to the inverters $24_j$ (j=1, 2, 3, 4) are made, and output terminals $Out_i$ through which outputs from the NAND gates $23_i$ (i=1, 2, 3, 4) are made.

Figure 10:
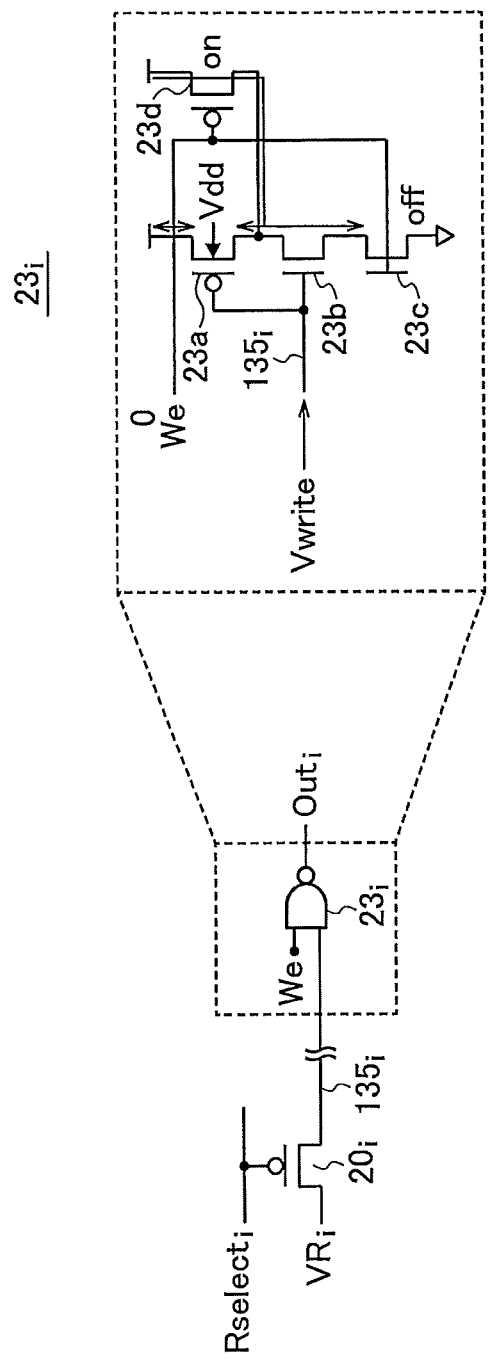
FIG. 10 is a circuit diagram showing a specific example of a NAND gate.

As for each NAND gate $23_i$ (i=1, 2, 3, 4), one of the two input terminals receives a write enable signal We, and the other input terminal is connected to a row wiring line $135_i$ (see the left sides of FIGS. 9 and 10). As shown in the right side of FIG. 10, each NAND gate $23_i$ (i=1, 2, 3, 4) includes a p-channel transistor 23a, n-channel transistors 23b and 23c, and a p-channel transistor 23d, which are connected in series. The gate of the transistor 23c and the gate of the transistor 23d receive the write enable signal We, and the gate of the transistor 23a and the gate of the transistor 23b receive a write voltage Vwrite from the row wiring line $135_i$. The drain of the transistor 23d is connected to the drain of the transistor 23a.

When the write enable signal We is at the Low level ("0" level) in a NAND gate $23_i$ (i=1, 2, 3, 4), a voltage, such as a power supply voltage Vdd, is applied via the transistor 23d to the common connecting node between the transistors 23a and 23b having the write voltage Vwrite to be applied to the gates thereof. The write voltage Vwrite is higher than the power supply voltage Vdd. As the transistor 23b is turned on by the write voltage Vwrite, and a channel is formed, the source and the drain of the transistor 23b have the same potential. The power supply voltage Vdd is constantly supplied to the source of the transistor 23a, and the power supply voltage Vdd is also supplied to the substrate potential. With this, the gate oxide films of the transistor 23b and the transistor 23a having the write voltage Vwrite to be applied to the gates thereof have a smaller potential difference than the potential difference necessary for writing with the above described applied voltage. Thus, breaking can be prevented. During an operation, the write enable signal We is set at the High level ("1" level) so that the NAND gate $23_i$ (i=1, 2, 3, 4) performs an inverter operation.

In the above described manner, gate leakage can be reduced in the transistors 23a and 23b. Thus, the transistors 23a and 23b can be protected from high voltages, without an increase in the power consumption. That is, in the integrated circuit of the first embodiment, the power consumption can be reduced.

Second Embodiment

Figure 11:
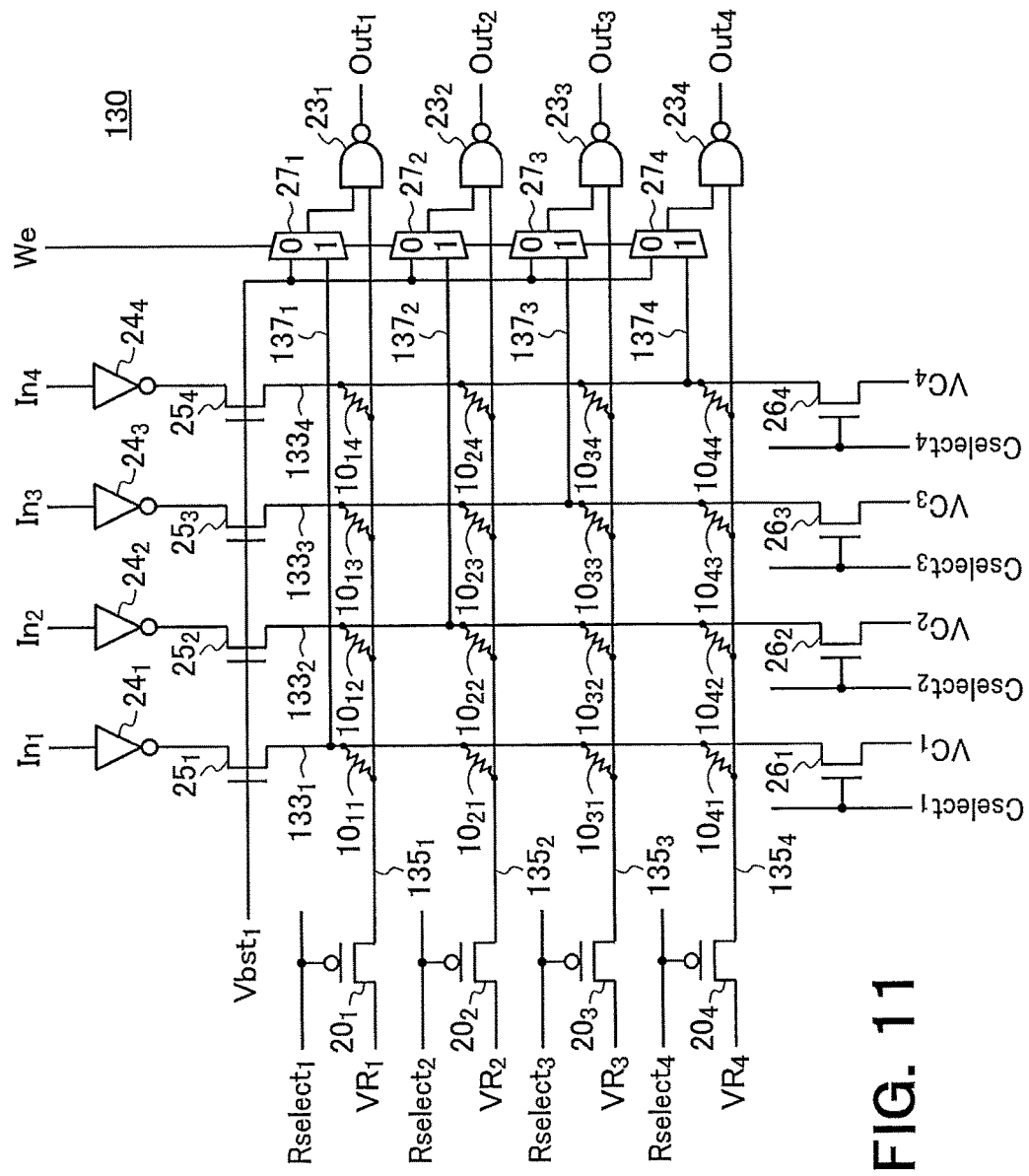
FIG. 11 is a circuit diagram showing an integrated circuit according to a second embodiment.

FIG. 11 shows an integrated circuit according to a second embodiment. This integrated circuit of the second embodiment has the same configuration as the integrated circuit of the first embodiment shown in FIG. 9, except for further including test circuits $27_1$ through $27_4$. Each test circuit $27_i$ (i=1, 2, 3, 4) is a multiplexer (a select circuit). One of the two input terminals receives a signal $Vbst_1$, for example, and the other input terminal is connected to a wiring line $133_i$, for example, and the output terminal is connected to one of the two input terminals of the NAND gate $23_i$. Alternatively, the other input terminal of each test circuit $27_i$ (i=1, 2, 3, 4) may be connected to one of the other three column wiring lines $133_2$ through $133_4$ other than the column wiring line $133_i$. In this case, the other input terminals of the test circuits $27_1$ through $27_4$ are connected to the different column wiring lines $133_1$ through $133_4$ from one another. In accordance with a write enable signal We, each test circuit $27_i$ (i=1, 2, 3, 4) selects one of the two input terminals, and connects the selected input terminal to the output terminal. As the test circuits $27_i$ (i=1, 2, 3, 4) are disposed, wiring lines $137_i$ connecting the other input terminals to the wiring lines or the column wiring lines $133_i$ connected to the other input terminals become bypasses, and turn into short-circuited lines $137_i$ that do not pass through the switch elements connected to the column wiring lines $133_i$. As the test circuits $27_1$ through $27_4$ are disposed as described above, the peripheral circuits of the switch elements can be tested even in a situation where writing is not to be performed on the switch elements.

Referring now to FIG. 12, operations at a time of writing, at a time of a normal operation, and at a time of testing in the integrated circuit of the second embodiment including the test circuits $27_1$ through $27_4$ are described. FIG. 12 is a table showing the signals to be applied to the respective terminals at a time of writing, at a time of an operation, and at a time of testing.

(Writing)

First, at a time of writing, the write enable signal We is set at Low (0). Since this is a write operation, the signal $Vbst_1$ is also set at Low (0). All the row select signals $Rselect_i$ (i=1, 2, 3, 4) are set at Low (0), all the column select signals $Cselect_i$ (i=1, 2, 3, 4) are set at High (1), the signal $VR_i$ to be applied to the row wiring line $135_i$ connected to the switch element on which writing is to be performed is set at the write voltage Vwrite, the signal VR to be applied to the other row wiring lines is set at a write inhibiting voltage Vinhibit, the signal VC to be applied to the column wiring line connected to the switch element on which the writing is to be performed is set at a voltage Vss, and the signal VC to be applied to the other column wiring lines is set at the write inhibiting voltage Vinhibit (FIG. 12).

With this, each test circuit $27_i$ (i=1, 2, 3, 4) transmits the signal $Vbst_1$ or a signal "0" to the NAND gate $23_i$, and enters the circuit protection state described in the first embodiment shown in FIG. 10. At a time of writing, signals from the input terminals $In_1$ through $In_4$ need to be shut off, and the signal $Vbst_1$ becomes 0. Therefore, this signal $Vbst_1$ is used, but some other signal may be used.

(Normal Operation)

In a normal operation, the signal $Vbst_1$ is set at High (1), and the write enable signal We is set at Low (0). All the row select signals $Rselect_i$ (i=1, 2, 3, 4) are set at High (1), all the column select signals $Cselect_i$ (i=1, 2, 3, 4) are set at Low (0), the signals $VR_1$ through $VR_4$ are set at the power supply voltage Vdd, and the signals $VC_1$ through $VC_4$ are set at the voltage Vss (FIG. 12).

With this, each test circuit $27_i$ (i=1, 2, 3, 4) transmits the signal $Vbst_1$ or a signal "1" to the NAND gate $23_i$, so that the NAND gate $23_i$ outputs the signal supplied from the wiring line $135_i$. That is, the NAND gates $23_1$ through $23_4$ enter the inverter operation state described in the first embodiment shown in FIG. 10, and the signals from the input terminals $In_1$ through $In_4$ are input to the NAND gates $23_1$ through $23_4$ via the switch elements.

(Testing)

At a time of testing, the write enable signal We is set at High (1), the signal $Vbst_1$ is set at High (1), all the row select signals $Rselect_i$ (i=1, 2, 3, 4) are set at Low (0), all the column select signals $Cselect_i$ (i=1, 2, 3, 4) are set at Low (0), the power supply voltage Vdd is applied to the signals $VR_1$ through $VR_4$, and the voltage Vss is applied to the signals $VC_1$ through $VC_4$ (FIG. 12).

As the write enable signal We is set at High (1), the test circuits $27_1$ through $27_4$ select short-circuited lines. All the row select signals $Rselect_1$ through $Rselect_4$ are set at Low (0), and the power supply voltage Vdd or a signal "1" is supplied from all the signals $VR_1$ through $VR_4$ to the NAND gates $23_1$ through $23_4$, so that the NAND gates $23_1$ through $23_4$ perform an inverter operation on the short-circuited lines.

In the above described manner, the signals from the input terminals $In_1$ through $In_4$ can be output from the output terminals $Out_1$ through $Out_4$, without any writing being performed on the switch elements. Thus, the circuits around the cross-point switch block can be tested.

Figure 13:
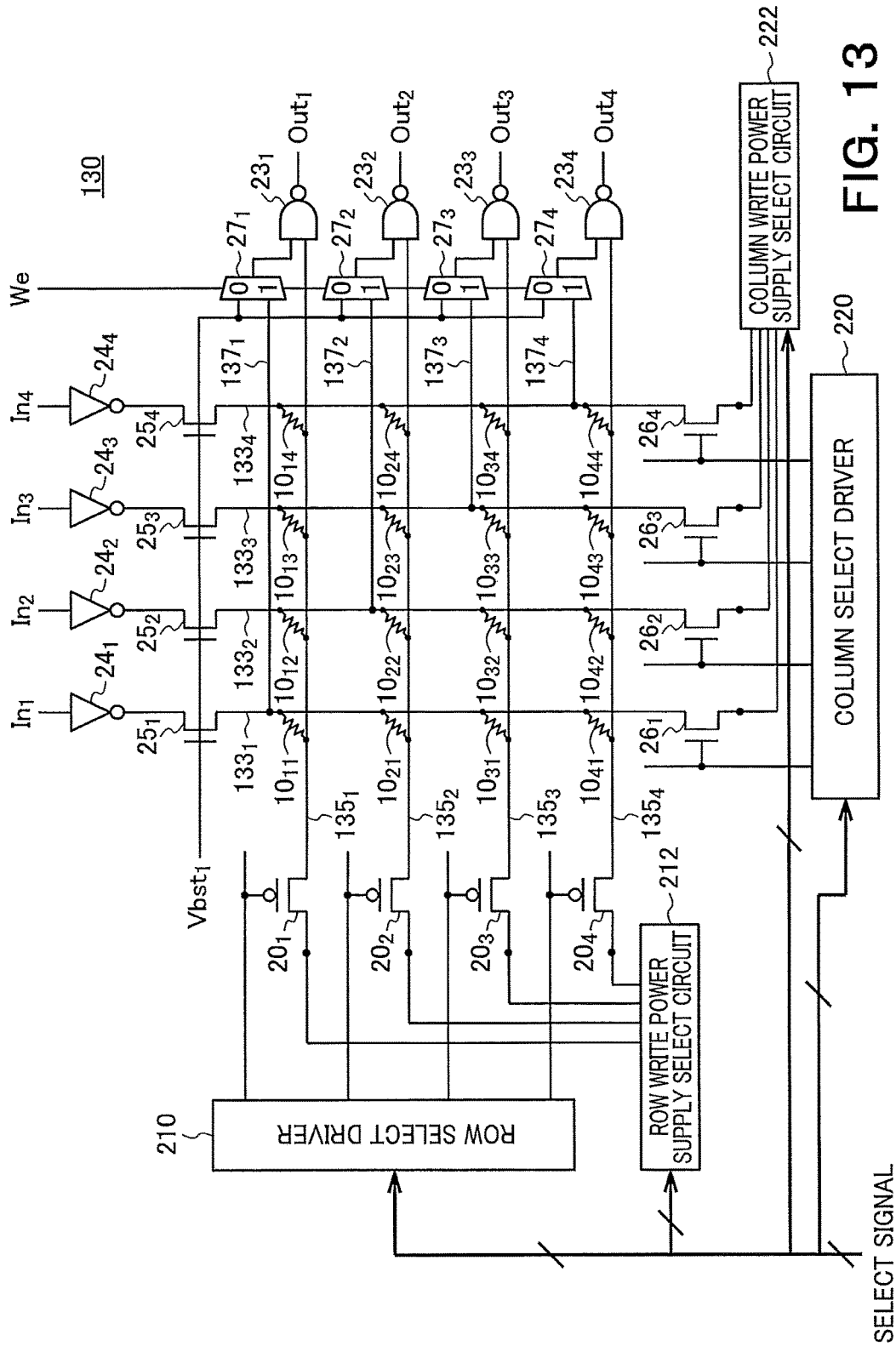
FIG. 13 is a circuit diagram showing the integrated circuit of the second embodiment including write circuits.

FIG. 13 shows a configuration including write circuits in the integrated circuit of the second embodiment.

The integrated circuit shown in FIG. 13 includes the switch block 130 shown in FIG. 11, a row select driver 210, a row write power supply select circuit (a power supply circuit) 212, a column select driver 220, and a column write power supply select circuit (a power supply circuit) 222.

The row write power supply select circuit 212 is connected to the gates of the transistors $20_1$ through $20_4$, the write voltage Vwrite is applied to one of the gates of the transistors $20_1$ through $20_4$ in accordance with a select signal, and the write inhibiting voltage Vinhibit is applied to the other gates.

The column write power supply select circuit 222 is connected to the gates of the transistors $26_1$ through $26_4$, the voltage Vss is applied to one of the gates of the transistors $26_1$ through $26_4$ in accordance with a select signal, and the write inhibiting voltage Vinhibit is applied to the other gates.

Where the switch elements are resistive change elements such as magnetic tunnel junction (MTJ) elements, oxidation-reduction resistive change elements, ion-conducting resistive change elements, or phase-change elements, signals of the same potential are applied to the outputs of the row select driver 210 and the column select driver 220 in the same switch block. That is, all the outputs of the row select driver 210 of the switch block in which writing is to be performed are set at Low (0), all the outputs of the column select driver 220 are set at High (1), all the outputs of the row select drivers of the switch blocks in which any writing is not to be performed are set at High (1), and all the outputs of the column select drivers of the switch blocks in which any writing is not to be performed are set at Low (0). These switching operations are performed in accordance with select signals.

Figure 14:
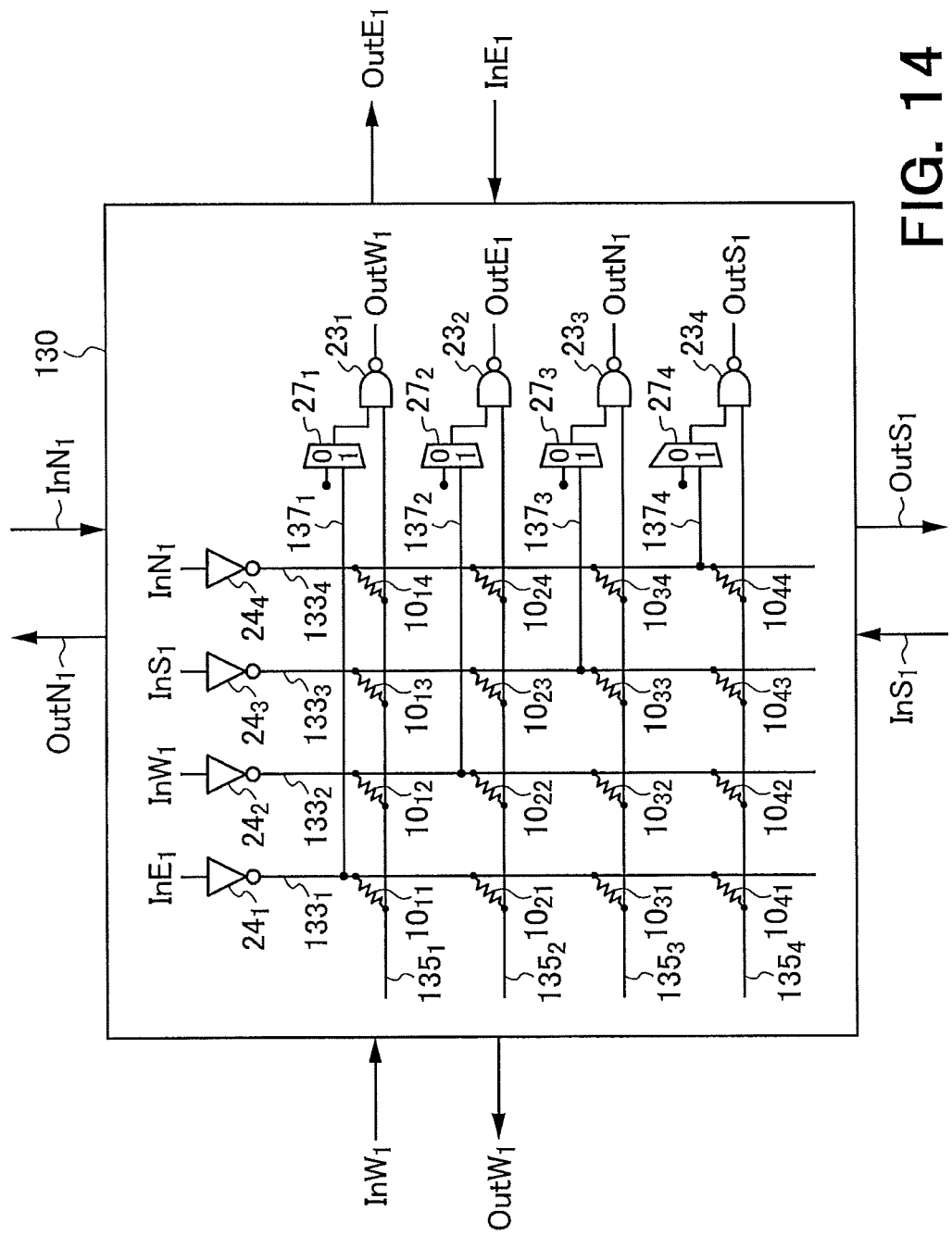
FIG. 14 is a diagram for explaining testing in the second embodiment.
Figure 15:
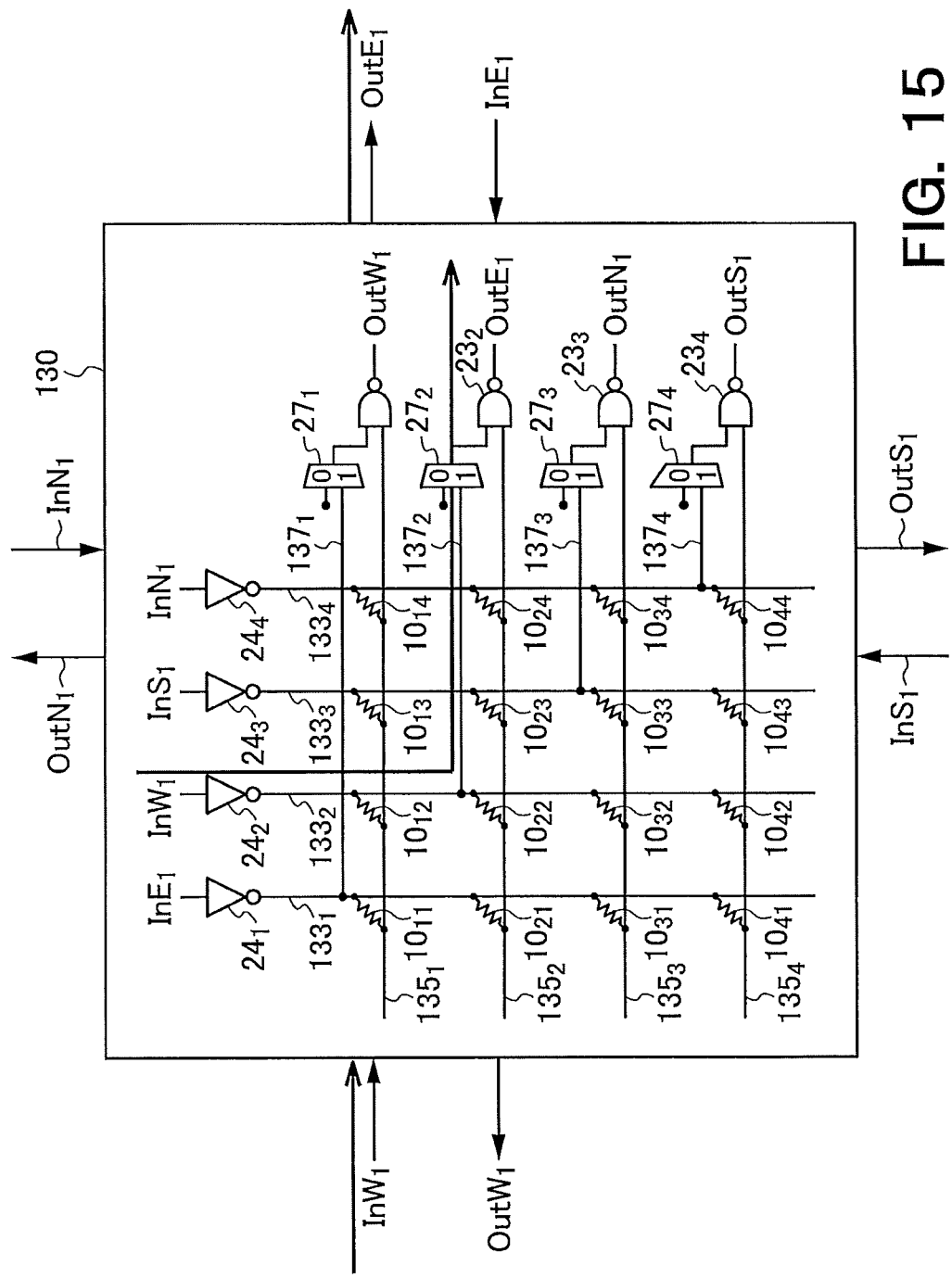
FIG. 15 is a diagram for explaining testing in the second embodiment.
Figure 16:
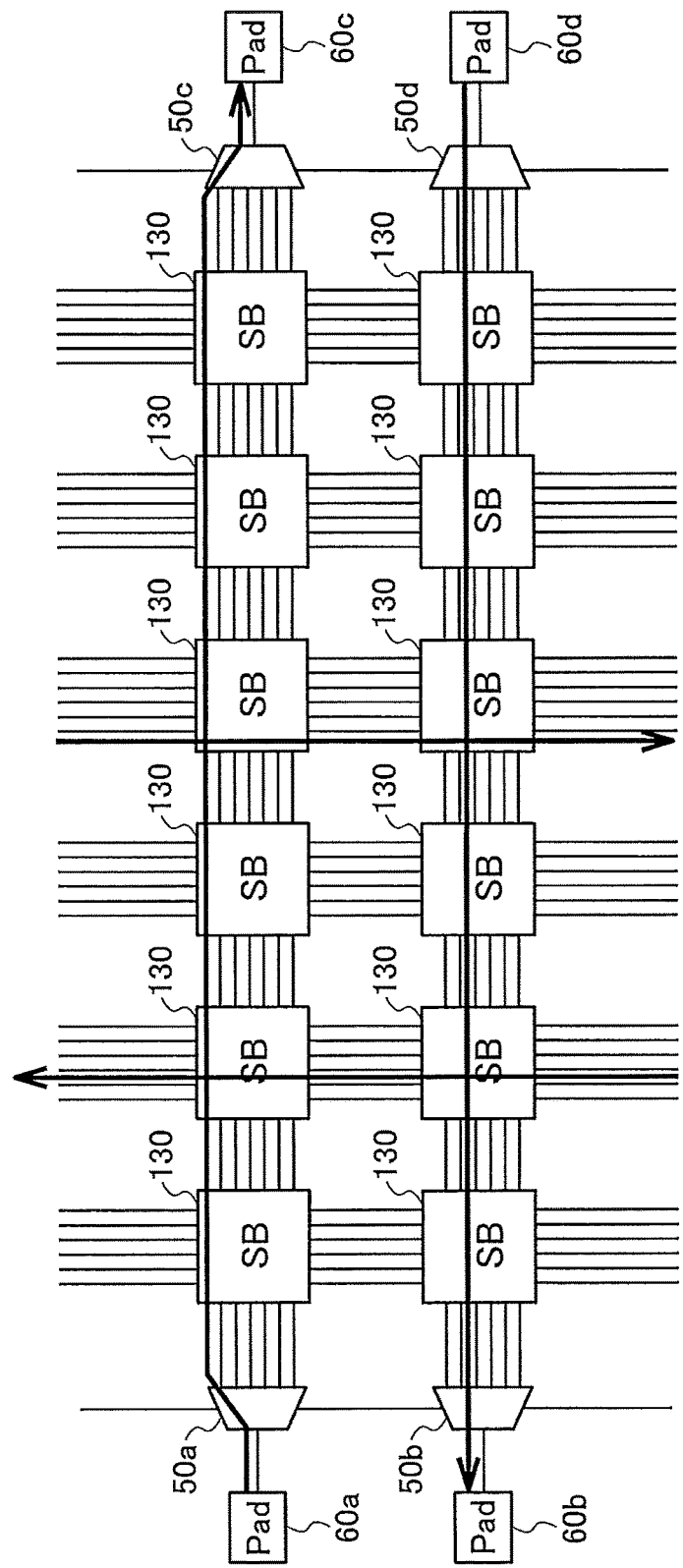
FIG. 16 is a diagram for explaining testing in the second embodiment.

Referring now to FIGS. 14 through 16, examples of actual testing are described. The switch block 130 includes input terminals and output terminals. As shown in FIG. 14, the switch block 130 includes input terminals $InW_1$, $InE_1$, $InN_1$, and $InS_1$, and output terminals $OutW_1$, $OutE_1$, $OutN_1$, and $OutS_1$, for example. The respective input and output terminals are connected to the input and output terminals of other switch blocks. For ease of explanation, the transistors $20_1$ through $20_4$ and the transistors $25_1$ through $25_4$ shown in FIG. 13 are not shown in FIG. 14.

Signals pass through such input and output terminals as shown in FIG. 15. For example, when a signal is input to the inverter $24_2$ via the input terminal $InW_1$, the signal is output from the output terminal $OutE_1$ via the column wiring line $133_2$, the wiring line $137_2$, the test circuit $27_2$, and the NAND gate $23_2$. A second switch block that has received this signal then passes the signal on to a third switch block, and this process is repeated. As shown in FIG. 16, signals are observed among pads 60a, 60b, 60c, and 60d that are capable of observing signals, and the passing of the signals can be checked. In a case where pads cannot be connected to the respective wiring lines, switching is conducted by multiplexer circuits 50a, 50b, 50c, and 50d, as shown in FIG. 16.

(First Modification)

Figure 17:
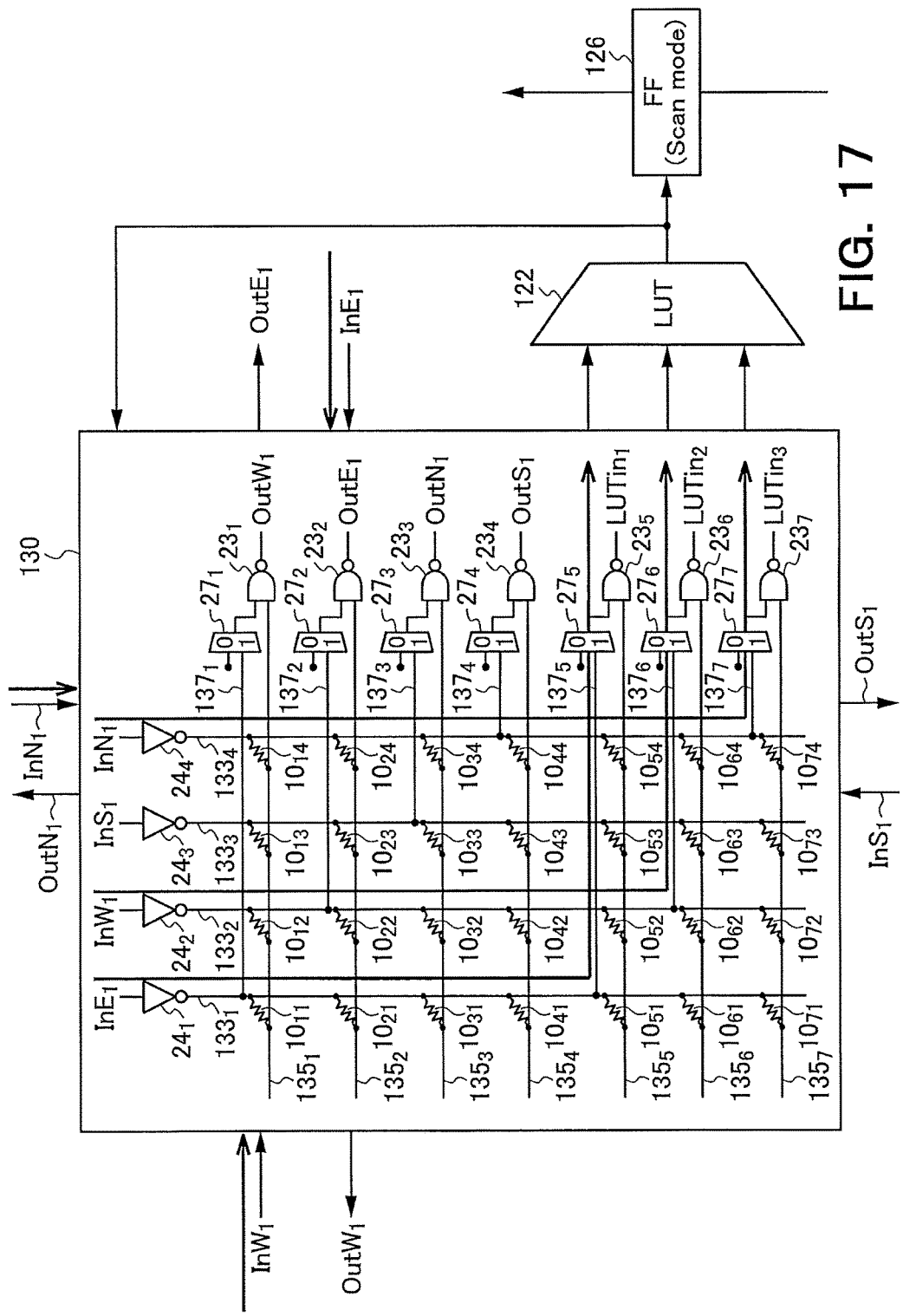
FIG. 17 is a circuit diagram showing an integrated circuit according to a first modification of the second embodiment.

Although a switch block is described in the above case, logics connected to a switch block include a look-up table circuit 122 and a flip-flop 126 that is connected to the output terminal of the look-up table circuit 122 and has a scan function, for example, as in an integrated circuit of a first modification shown in FIG. 17. This integrated circuit of the first modification shown in FIG. 17 has the same configuration as the integrated circuit shown in FIG. 15, except for further including row wiring lines $135_5$ through $135_7$, short-circuited lines $137_5$ through $137_7$, test circuits $27_5$ through $27_7$, NAND gates $23_5$ through $23_7$, and switch elements $10_{51}$ through $10_{74}$ provided in the cross regions between the row wiring lines $135_5$ through $135_7$ and the column wiring lines $133_1$ through $133_4$.

Each short-circuited line $137_i$ (i=5, 6, 7) has one end connected to the column wiring line $133_i$. As for each test circuit $27_i$ (i=5, 6, 7), one of the two input terminals receives the signal $Vbst_1$ as in FIG. 13, the other input terminal is connected to the other end of the short-circuited line $137_i$, and the output terminal is connected to one of the two input terminals of the NAND gate $23_i$. Each NAND gate $23_{i+4}$ (i=1, 2, 3) has the other input terminal connected to the row wiring line $135_{i+4}$, and outputs a signal $LUTin_i$ from the output terminal.

With this configuration, operations of the look-up table circuit 122 can be checked with the flip-flop 126 having a scan function. Although the short-circuited lines $137_i$ (i=1, 2, 3, 4, 5, 6, 7) shown in FIG. 17 are connected to the column wiring lines $133_i$, the short-circuited lines $137_i$ may be connected to other column wiring lines. In this case, the short-circuited lines $137_1$ through $137_7$ are connected to different column wiring lines from one another.

(Second Modification)

Figure 18:
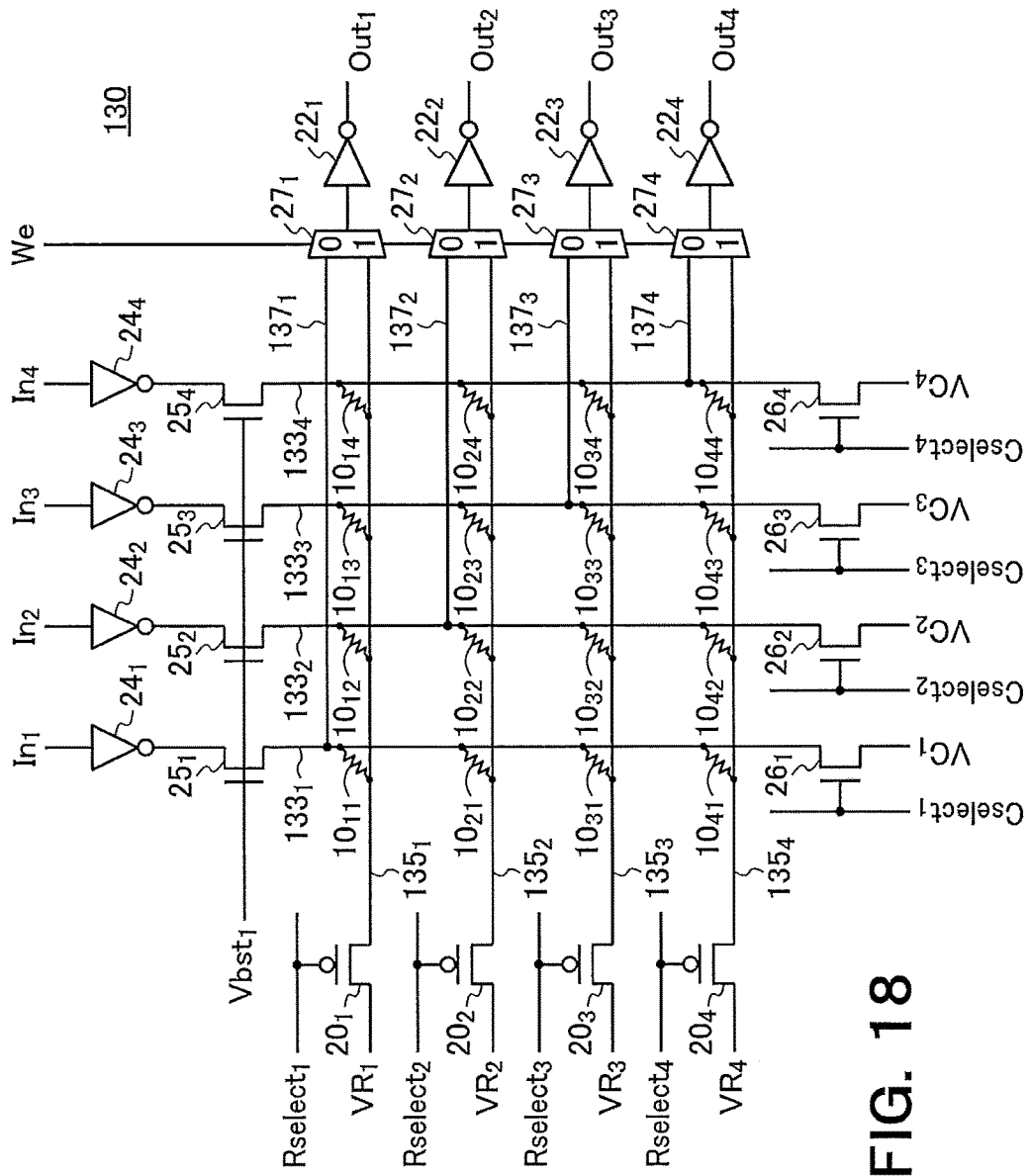
FIG. 18 is a circuit diagram showing an integrated circuit according to a second modification of the second embodiment.

If the write voltage for the switch elements is lower than the voltage that breaks a peripheral circuit, inverters $22_1$ through $22_4$, instead of the NAND gates $23_1$ through $23_4$, may be used as in an integrated circuit of a second modification shown in FIG. 18.

(Third Modification)

Figure 19:
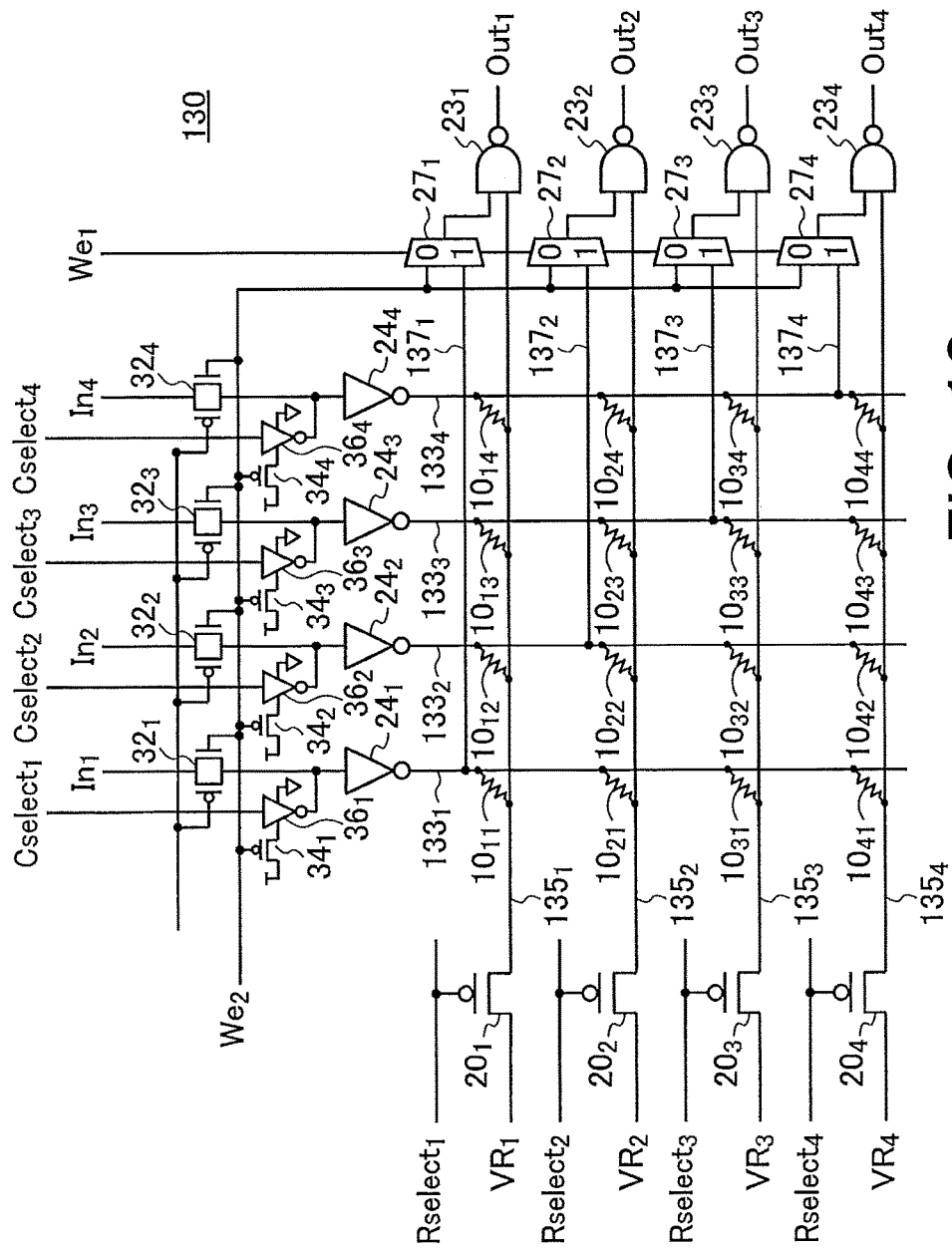
FIG. 19 is a circuit diagram showing an integrated circuit according to a third modification of the second embodiment.

In a case where a power supply voltage can be used as the write inhibiting voltage Vinhibit, an integrated circuit may be formed as in a third modification shown in FIG. 19. This integrated circuit of the third modification has the same configuration as the integrated circuit of the second embodiment shown in FIG. 11, except that the transistors $25_1$ through $25_4$ and the transistors $26_1$ through $26_4$ are deleted, and transfer gates $32_1$ through $32_4$, p-channel transistors $34_1$ through $34_4$, and inverters $36_1$ through $36_4$ are newly provided.

Each transfer gate $32_j$ (j=1, 2, 3, 4) is disposed between the input terminal $In_j$ and the input terminal of the inverter $24_i$. Each transistor $34_j$ (j=1, 2, 3, 4) receives an enable signal $We_2$ at the gate, and has the power supply voltage Vdd connected to the source. Each inverter $36_j$ (j=1, 2, 3, 4) operates in accordance with a signal from the drain of the transistor $34_j$, receives the column select signal $Cselect_j$ at the input terminal, and has the output terminal connected to the input terminal of the inverter $24_i$.

Referring now to FIG. 20, operations at a time of writing, at a time of a normal operation, and at a time of testing in the integrated circuit of the third modification having the above configuration are described. FIG. 20 is a table showing the signals to be applied to the respective terminals at a time of writing, at a time of an operation, and at a time of testing.

(Writing)

At a time of writing, an enable signal $We_1$ is first set at Low (0), the enable signal $We_2$ is set at Low (0), the row select signals $Rselect_1$ through $Rselect_4$ are set at Low (0), the signal $VR_i$ to be applied to the row wiring line $135_i$ connected to the switch element on which writing is to be performed is set at the write voltage Vwrite, the signal VR to be applied to the other row wiring lines is set at the write inhibiting voltage Vinhibit, the column select signal Cselect of the switch element on which writing is to be performed is set at Low (0), and the other column select signals are set at High (1) (FIG. 20).

As the enable signal $We_1$ is set at Low (0), each test circuit $27_i$ (i=1, 2, 3, 4) transmits the signal $We_2$ or a signal "0" to the NAND gate $23_i$, and enters the circuit protection state described in the second embodiment shown in FIG. 11.

Like the above described signal $Vbst_1$ in FIG. 11, the enable signal $We_2$ is at Low (0), and therefore, is shared in this example. However, some other signal may be used.

(Normal Operation)

At a time of a normal operation, the enable signal $We_1$ is set at Low (0), the enable signal $We_2$ is set at High (1), all the row select signals $Rselect_1$ through $Rselect_4$ are set at High (1), all the signals $VR_1$ through $VR_4$ are set at Vdd, and all the column select signals $Cselect_1$ through $Cselect_4$ are set at Vss (FIG. 20).

As the enable signal $We_2$ is set at High (1), each test circuit $27_i$ (i=1, 2, 3, 4) transmits a signal "0" to the NAND gate $23_i$, so that the NAND gate $23_i$ outputs the signal supplied from the wiring line $135_i$. That is, the NAND gates $23_1$ through $23_4$ enter the inverter operation state described in the first embodiment shown in FIG. 10, and the signals from the input terminals $In_1$ through $In_4$ are input to the NAND gates $23_1$ through $23_4$ via the switch elements.

Also, as the power supply side of each inverter $36_j$ (j=1, 2, 3, 4) that receives a write signal is shut off by the transistor $34_j$, this inverter $36_j$ enters a floating state and cannot avoid an input signal if the column select signal $Cselect_j$ is at Low (0).

(Testing)

At a time of testing, the enable signal $We_1$ is set at High (1), the enable signal $We_2$ is set at High (1), all the row select signals $Rselect_1$ through $Rselect_4$ are set at Low (0), all the signals $VR_1$ through $VR_4$ are set at Vdd, and all the column select signals $Cselect_1$ through $Cselect_4$ are set at Vss (FIG. 20).

As the enable signal $We_1$ is set at High (1), the short-circuited lines $137_1$ through $137_4$ are selected. At this point, all the row select signals $Rselect_1$ through $Rselect_4$ are set at Low (0), and the power supply voltage Vdd or a signal "1" is supplied from all the signals $VR_1$ through $VR_4$.

With this, the NAND gates $23_1$ through $23_4$ perform inverter operations with respect to the short-circuited lines $137_1$ through $137_4$, as in the second embodiment shown in FIG. 11.

In the above described manner, the signals from the input terminals $In_1$ through $In_4$ can be output from the output terminals $Out_1$ through $Out_4$, without any writing being performed on the switch elements. Thus, the circuits around the cross-point switch block can be tested.

Figure 21:
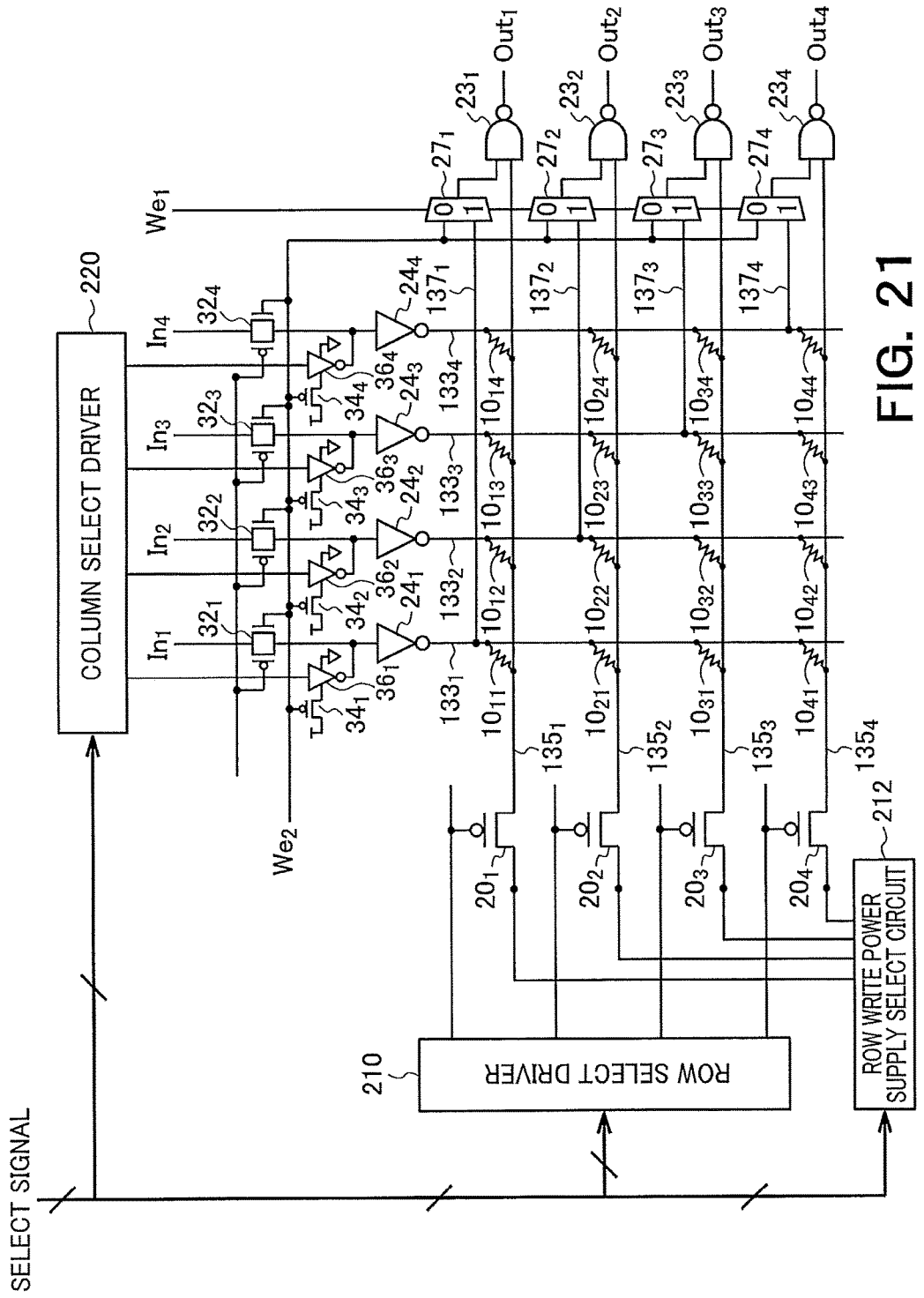
FIG. 21 is a circuit diagram showing an integrated circuit of the third modification of the second embodiment including a write circuit.

FIG. 21 shows a configuration including a write circuit in the integrated circuit of the third modification. The integrated circuit shown in FIG. 21 includes the integrated circuit shown in FIG. 19, a row select driver 210, a row write power supply select circuit 212, and a column select driver 220. The row select driver 210 is connected to the gates of the transistors $20_1$ through $20_4$. The row write power supply select circuit 212 is connected to the sources of the transistors $20_1$ through $20_4$. The column select driver 220 is connected to the input terminals of the inverters $36_1$ through $36_4$, and outputs the column select signals $Cselect_1$ through $Cselect_4$.

In accordance with a select signal, the row write power supply select circuit 212 supplies the write voltage Vwrite to one of the output terminals, and supplies the write inhibiting voltage Vinhibit to the other output terminals. Where the switch elements $10_{11}$ through $10_{44}$ are resistive change elements such as magnetic tunnel junction (MTJ) elements, oxidation-reduction resistive change elements, ion-conducting resistive change elements, or phase-change elements, signals of the same potential are applied to the outputs of the row select driver 210 and the column select driver 220 in the same switch block. That is, all the outputs of the row select driver 210 of the switch block in which writing is to be performed are set at Low (0), all the outputs of the column select driver 220 are set at High (1), all the outputs of the row select drivers 210 of the switch blocks in which any writing is not to be performed are set at High (1), and all the outputs of the column select drivers 220 of the switch blocks in which any writing is not to be performed are set at Low (0). These switching operations are performed in accordance with select signals.

In a case where the switch elements are of an anti-fuse type, on the other hand, the probability of wrong writing is low. Therefore, the write inhibiting voltage Vinhibit may not be applied to the switch elements, and the switch elements may be put into a floating state. Specifically, the row write power supply select circuit 212 applies the write power supply to all the output terminals, and the row select driver 210 sets the row wiring line to be selected at Low (0), and sets the row wiring lines not to be selected at High (1). As the write inhibiting voltage Vinhibit is not used, the number of kinds of power supplies becomes smaller. Thus, the circuit configuration can be simplified.

As described above, like the first embodiment, the second embodiment can also reduce power consumption.

Third Embodiment

Figure 22:
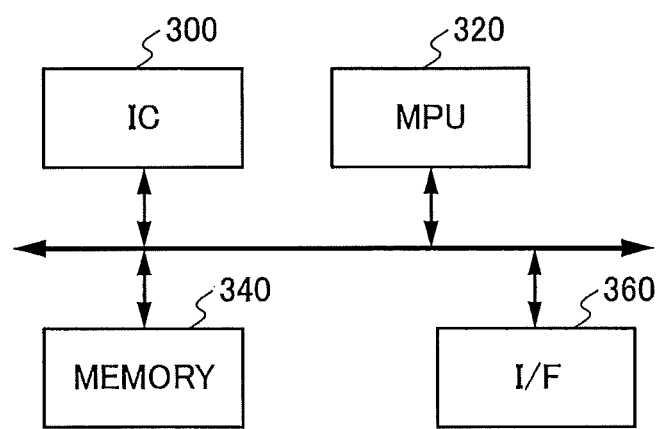
FIG. 22 is a block diagram showing an electronic apparatus according to a third embodiment.

FIG. 22 shows an electronic apparatus according to a third embodiment. The electronic apparatus of the third embodiment includes a circuit 300 including the integrated circuit of any of the first and second embodiments and the modifications thereof, a microprocessor (hereinafter, also referred to as micro-processing unit (MPU)) 320, a memory 340, and an interface (I/F) 360. These components are connected to one another via a bus line 380.

The MPU 320 operates in accordance with a program. The program for the MPU 320 to operate is stored beforehand into the memory 340. The memory 340 is also used as a work memory for the MPU 320 to operate. The interface 360 communicates with an external device, under the control of the MPU 320.

The third embodiment can achieve the same effects as those of the first and second embodiments and the modifications thereof.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An integrated circuit comprising:
    a first wiring line;
    second and third wiring lines intersecting with the first wiring line;
    a first input terminal connected to the second wiring line;
    a second input terminal connected to the third wiring line;
    a first control terminal;
    a second control terminal;
    an output terminal;
    a first switch element disposed in a cross region between the first wiring line and the second wiring line, the first switch element including a first terminal connected to the first wiring line and a second terminal connected to the second wiring line;
    a second switch element disposed in a cross region between the first wiring line and the third wiring line, the second switch element including a third terminal connected to the first wiring line and a fourth terminal connected to the third wiring line;
    a first transistor including a source and a drain, one of the source and the drain being connected to the first wiring line;
    a select circuit including a fifth terminal connected to the second control terminal, a sixth terminal connected to the second wiring line, a seventh terminal connected to the first control terminal, and an eighth terminal, the select circuit connecting the eighth terminal to one of the fifth and sixth terminals in accordance with a first control signal from the first control terminal; and
    a logic circuit including a ninth terminal connected to the eighth terminal, a tenth terminal connected to the first wiring line, and an eleventh terminal connected to the output terminal.

2. The circuit according to claim 1, further comprising:
    a second transistor including a source and a drain, one of the source and the drain being connected to the second wiring line; and
    a third transistor including a source and a drain, one of the source and the drain being connected to the third wiring line.

3. The circuit according to claim 2, further comprising:
    a first driver connected to a gate of the first transistor;
    a first power supply circuit configured to supply power, the first power supply circuit being connected to the other one of the source and the drain of the first transistor;

a second driver connected to respective gates of the second and third transistors; and
a second power supply circuit configured to supply power to the other ones of the sources and the drains of the second and third transistors, the second power supply circuit being connected to the other ones of the sources and the drains of the second and third transistors.

4. The circuit according to claim 1, further comprising:
a first inverter including an input terminal electrically connected to the first input terminal, and an output terminal electrically connected to the second wiring line;
a second inverter including an input terminal electrically connected to the second input terminal, and an output terminal electrically connected to the third wiring line;
a first transfer gate disposed between the input terminal of the first inverter and the first input terminal;
a second transfer gate disposed between the input terminal of the second inverter and the second input terminal;
a third inverter including an input terminal to receive a signal for selecting the second wiring line, and an output terminal connected to the input terminal of the first inverter, the third inverter operating in accordance with a second control signal; and
a fourth inverter including an input terminal to receive a signal for selecting the third wiring line, and an output terminal connected to the input terminal of the second inverter, the fourth inverter operating in accordance with the second control signal.

5. The circuit according to claim 4, further comprising:
a first driver connected to a gate of the first transistor;
a first power supply circuit configured to supply power, the first power supply circuit being connected to the other one of the source and the drain of the first transistor; and
a second driver connected to the input terminals of the third and fourth inverters.

6. The circuit according to claim 1, wherein the first and second switch elements are resistive change elements or anti-fuse elements.

7. An integrated circuit comprising:
a first wiring line;
second and third wiring lines intersecting with the first wiring line;
a first input terminal connected to the second wiring line;
a second input terminal connected to the third wiring line;
a first control terminal;
an output terminal;
a first switch element disposed in a cross region between the first wiring line and the second wiring line, the first switch element including a first terminal connected to the first wiring line and a second terminal connected to the second wiring line;
a second switch element disposed in a cross region between the first wiring line and the third wiring line, the second switch element including a third terminal connected to the first wiring line and a fourth terminal connected to the third wiring line;
a first transistor including a source and a drain, one of the source and the drain being connected to the first wiring line; and
a select circuit including a fifth terminal connected to the second wiring line, a sixth terminal connected to the first wiring line, and a seventh terminal electrically connected to the output terminal, the select circuit having the seventh terminal connected to one of the fifth and sixth terminals in accordance with a first control signal from the first control terminal.

8. The circuit according to claim 7, further comprising:
a second transistor including a source and a drain, one of the source and the drain being connected to the second wiring line; and
a third transistor including a source and a drain, one of the source and the drain being connected to the third wiring line.

9. The circuit according to claim 8, further comprising:
a first driver connected to a gate of the first transistor;
a first power supply circuit configured to supply power, the first power supply circuit being connected to the other one of the source and the drain of the first transistor;
a second driver connected to respective gates of the second and third transistors; and
a second power supply circuit configured to supply power to the other ones of the sources and the drains of the second and third transistors, the second power supply circuit being connected to the other ones of the sources and the drains of the second and third transistors.

10. The circuit according to claim 7, further comprising:
a first inverter including an input terminal electrically connected to the first input terminal, and an output terminal electrically connected to the second wiring line;
a second inverter including an input terminal electrically connected to the second input terminal, and an output terminal electrically connected to the third wiring line;
a first transfer gate disposed between the input terminal of the first inverter and the first input terminal;
a second transfer gate disposed between the input terminal of the second inverter and the second input terminal;
a third inverter including an input terminal to receive a signal for selecting the second wiring line, and an output terminal connected to the input terminal of the first inverter, the third inverter operating in accordance with a second control signal; and
a fourth inverter including an input terminal to receive a signal for selecting the third wiring line, and an output terminal connected to the input terminal of the second inverter, the fourth inverter operating in accordance with the second control signal.

11. The circuit according to claim 10, further comprising:
a first driver connected to a gate of the first transistor;
a first power supply circuit configured to supply power, the first power supply circuit being connected to the other one of the source and the drain of the first transistor; and
a second driver connected to the input terminals of the third and fourth inverters.

12. The circuit according to claim 7, wherein the first and second switch elements are resistive change elements or anti-fuse elements.

13. An integrated circuit comprising:
a first wiring line;
second and third wiring lines intersecting with the first wiring line;
a first input terminal connected to the second wiring line;
a second input terminal connected to the third wiring line;
a first control terminal;
an output terminal;
a first switch element disposed in a cross region between the first wiring line and the second wiring line, the first switch element including a first terminal connected to the first wiring line and a second terminal connected to the second wiring line;

a second switch element disposed in a cross region between the first wiring line and the third wiring line, the second switch element including a third terminal connected to the first wiring line and a fourth terminal connected to the third wiring line;

a first transistor including a source and a drain, one of the source and the drain being connected to the first wiring line;

a logic circuit including a fifth terminal connected to the first control terminal, a sixth terminal connected to the first wiring line, and a seventh terminal electrically connected to the output terminal;

a second transistor including a source and a drain, one of the source and the drain being connected to the second wiring line;

a third transistor including a source and a drain, one of the source and the drain being connected to the third wiring line;

a first driver connected to a gate of the first transistor;

a first power supply circuit configured to supply power, the first power supply circuit being connected to the other one of the source and the drain of the first transistor;

a second driver connected to respective gates of the second and third transistors; and a second power supply circuit configured to supply power to the other ones of the sources and the drains of the second and third transistors, the second power supply circuit being connected to the other ones of the sources and the drains of the second and third transistors.

14. The circuit according to claim 13, further comprising:

a first inverter including an input terminal electrically connected to the first input terminal, and an output terminal electrically connected to the second wiring line;

a second inverter including an input terminal electrically connected to the second input terminal, and an output terminal electrically connected to the third wiring line;

a first transfer gate disposed between the input terminal of the first inverter and the first input terminal;

a second transfer gate disposed between the input terminal of the second inverter and the second input terminal;

a third inverter including an input terminal to receive a signal for selecting the second wiring line, and an output terminal connected to the input terminal of the first inverter, the third inverter operating in accordance with a second control signal; and a fourth inverter including an input terminal to receive a signal for selecting the third wiring line, and an output terminal connected to the input terminal of the second inverter, the fourth inverter operating in accordance with the second control signal.

15. The circuit according to claim 14, further comprising:

a first driver connected to a gate of the first transistor;

a first power supply circuit configured to supply power, the first power supply circuit being connected to the other one of the source and the drain of the first transistor; and a second driver connected to the input terminals of the third and fourth inverters.

16. The circuit according to claim 13, wherein the first and second switch elements are resistive change elements or anti-fuse elements.

17. An electronic apparatus comprising:

the integrated circuit according to claim 1;

a memory storing a program; and a processor configured to perform processing on the integrated circuit in accordance with the program stored in the memory.

* * * * *